(12) United States Patent
Kiyota et al.

(10) Patent No.: US 7,831,124 B2
(45) Date of Patent: Nov. 9, 2010

(54) PHOTONIC CRYSTAL OPTICAL DEVICE

(75) Inventors: Kazuaki Kiyota, Tokyo (JP); Toshihiko Baba, Yokohama (JP)

(73) Assignees: The Furukawa Electric Co., Ltd., Tokyo (JP); National University Corporation Yokohama National University, Yokohama-shi (JP)

( * ) Notice: Subject to any disclaimer, the term of this patent is extended or adjusted under 35 U.S.C. 154(b) by 0 days.

(21) Appl. No.: 12/170,456

(22) Filed: Jul. 10, 2008

(65) Prior Publication Data

US 2008/0273832 A1      Nov. 6, 2008

Related U.S. Application Data

(63) Continuation of application No. PCT/JP2007/068260, filed on Sep. 20, 2007.

(30) Foreign Application Priority Data

Sep. 21, 2006   (JP)   .............................. 2006-256307

(51) Int. Cl.
  *G02B 6/10* (2006.01)
  *G02B 6/12* (2006.01)
  *H01S 3/08* (2006.01)
  *H01L 27/15* (2006.01)
  *H01L 29/26* (2006.01)
  *H01L 31/12* (2006.01)
  *H01L 33/00* (2006.01)

(52) U.S. Cl. .......................... 385/131; 385/132; 385/14; 385/129; 372/98; 372/92; 257/79; 257/98

(58) Field of Classification Search ................. 385/100, 385/14, 129, 131, 132; 372/98, 92; 257/98, 257/79

See application file for complete search history.

(56) References Cited

U.S. PATENT DOCUMENTS 5,684,817 A * 11/1997 Houdre et al. ........... 372/45.01

(Continued)

FOREIGN PATENT DOCUMENTS

JP      2005-64471 A      3/2005

(Continued)

OTHER PUBLICATIONS

"Characterization of Photonic Crystal Waveguide for SOA Operation," by Mizuta et al, Proceedings of Conference on Lasers and Electro-Optics Pacific Rim, Jul. 30-Aug. 2, 2005, paper CThE1-4, pp. 1134-1135.*

(Continued)

*Primary Examiner*—Charlie Peng
*Assistant Examiner*—Robert Tavlykaev
(74) *Attorney, Agent, or Firm*—Oblon, Spivak, McClelland, Maier & Neustadt, L.L.P.

(57) ABSTRACT

An active area includes a photonic-crystal optical waveguide formed by periodically arranging a plurality of holes in a primary plane direction of an active-area core layer in an active-area growth portion. A passive area includes a passive optical waveguide formed in a passive-area growth portion. An effective refractive index of a growth structure of the active-area growth portion is larger than an effective refractive index of a growth structure of the passive-area growth portion, and an active layer has a gain at a zero group-velocity point positioned on a high-frequency side of a dispersion curve of the photonic-crystal optical waveguide.

13 Claims, 17 Drawing Sheets

U.S. PATENT DOCUMENTS

2004/0125832 A1* 7/2004 Mahnkopf et al. ............ 372/20
2005/0018734 A1 1/2005 Sugitatsu et al.

FOREIGN PATENT DOCUMENTS

JP 2007-220922 A 8/2007

OTHER PUBLICATIONS

"Eigenwaves in One-Dimensional Photonic Crystals with Gain," by Mel'nikov et al, Optics and Spectroscopy, vol. 94, No. 3, 2003, pp. 411-417.*

"Two-Channel tunable Laser Diode Based on Photonic Crystals," by Mahnkopf et al, IEEE Photonics Technology Letters, vol. 16, No. 2, Feb. 2004, pp. 353-355.*

Wikipedia article "Laser diode".*

"Demonstration of various low group velocity effects in photonic crystal line defect waveguides by laser oscillation," by Kiyota et al, 18th Annual Meeting of the Lasers and Electro-Optics Society, Oct. 22-28, 2005, paper TuR3, pp. 318-319.*

"Theoretical analysis of feedback mechanisms of two-dimensional finite-sized photonic-crystal lasers," by Nojima, journal of Applied Physics, vol. 98, 2005, pp. 043102-1 to 043102-9.*

"Enhancement of nonlinear effects using photonic crystals," by Soljacic et al, Nature Materials, vol. 3, Apr. 2004, pp. 211-219.*

"Singlemode lightwave transmission in SOI-type photonic-crystal line-defect waveguides with phase-shifted holes," by Yamada et al, Electronics Letters, vol. 38, No. 2, Jan. 2002, pp. 74-75.*

"Optical-gain enhancement in two-dimensional active photonic crystals," by Nojima, Journal of Applied Physics, vol. 90, No. 2, Jul. 2001, pp. 545-551.*

"Photonic crystal devices," by O'Brien et al, Proceedings of the 6th IEEE Conference on Nanotechonlogy, Cincinnati, OH, Jul. 16-20, 2006.*

"Wavelength dependence of the modal refractive index in 1.3 um InGaAsP, AlGaInAs and GaInNAs lasers using high pressure," by Jin et al, Phys. Stat. Sol. (B), vol. 235, No. 2, 2003, pp. 491-495.*

Talneau, et al., "High external efficiency in a monomode full-photonic-crystal laser under continuous wave electrical injection", Applied Physics Letters, vol. 85, No. 11, Sep. 13, 2004, pp. 1913-1915.

Takano, et al., "In-plane-type channel drop filter in a two-dimensional photonic crystal slab", Applied Physics Letters, vol. 84, No. 13, Mar. 29, 2004, pp. 2226-2228.

U.S. Appl. No. 12/166,595, filed Jul. 2, 2008, Kiyota.

* cited by examiner

FIG.7
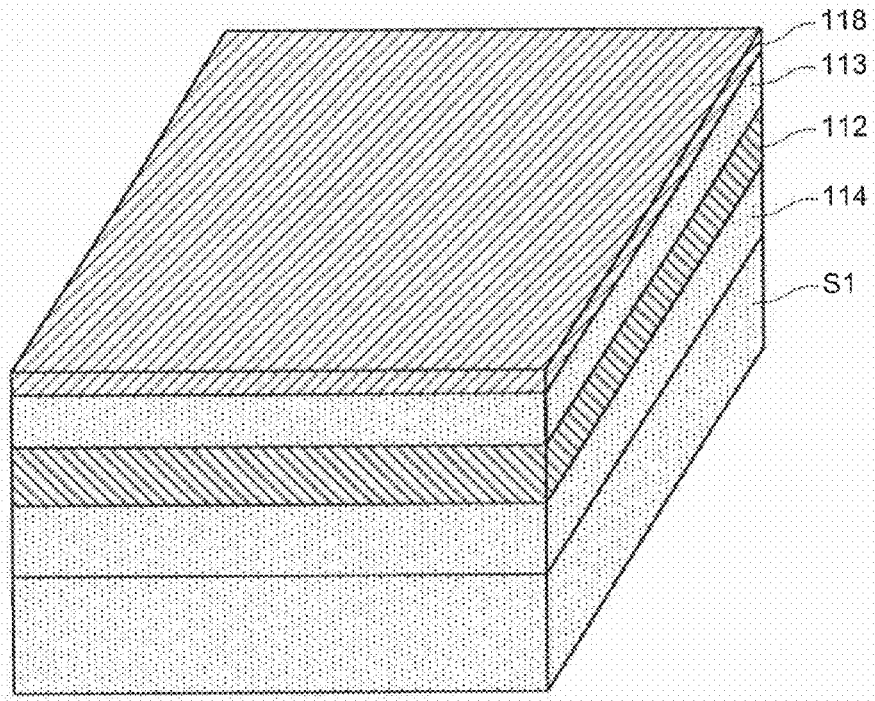
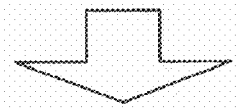
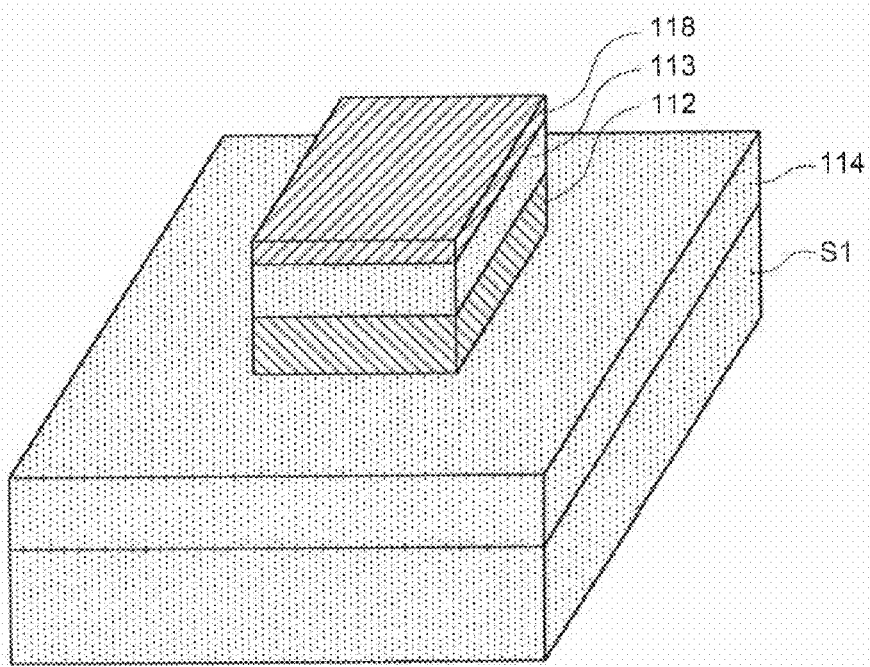

FIG. 8
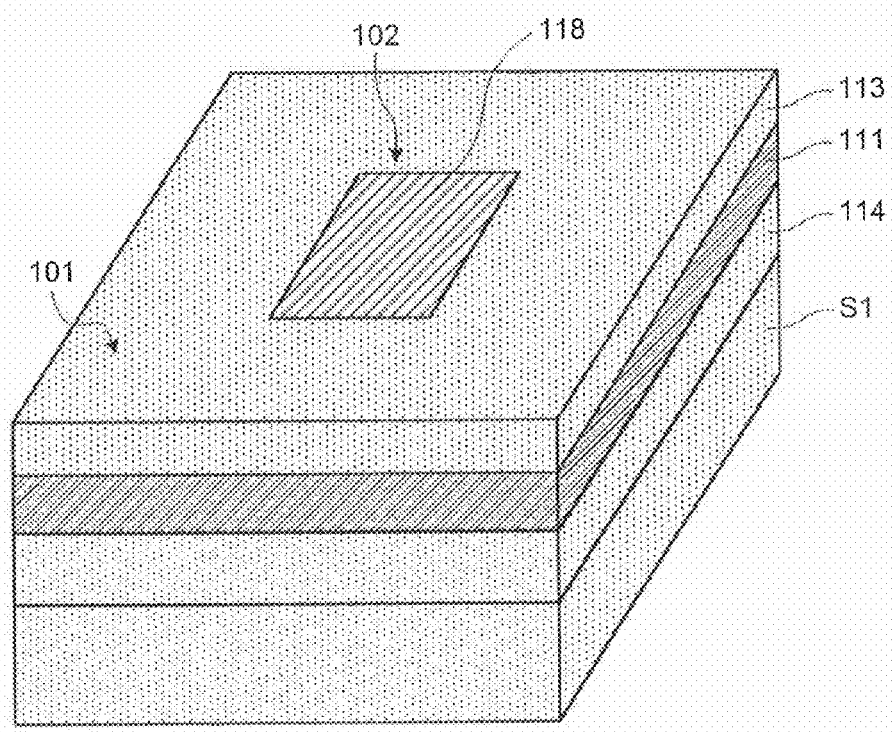
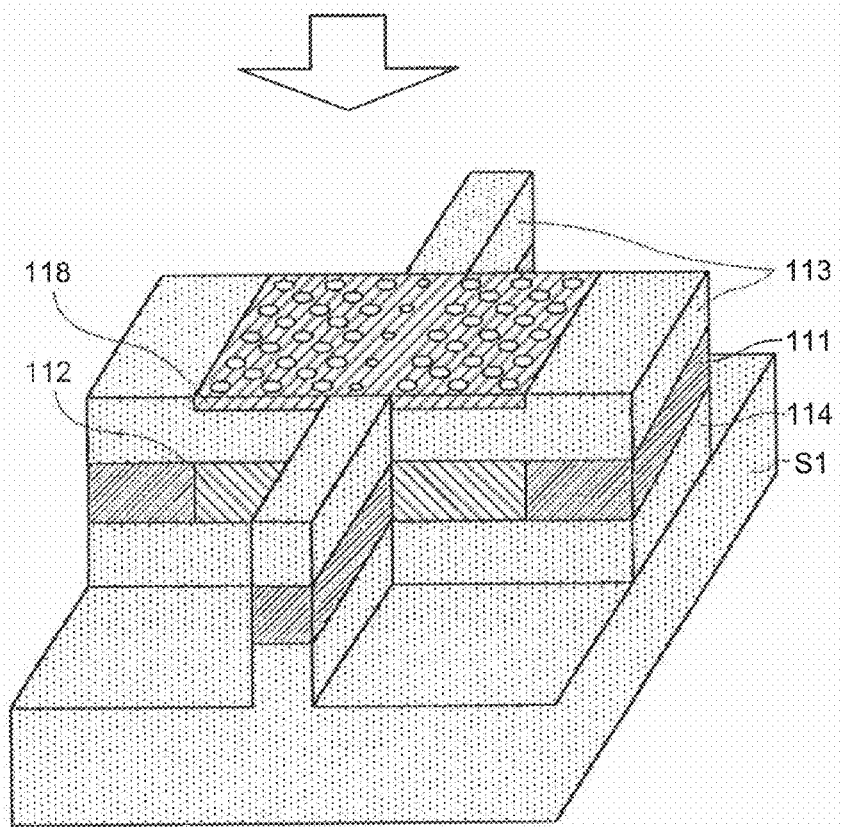

FIG.9
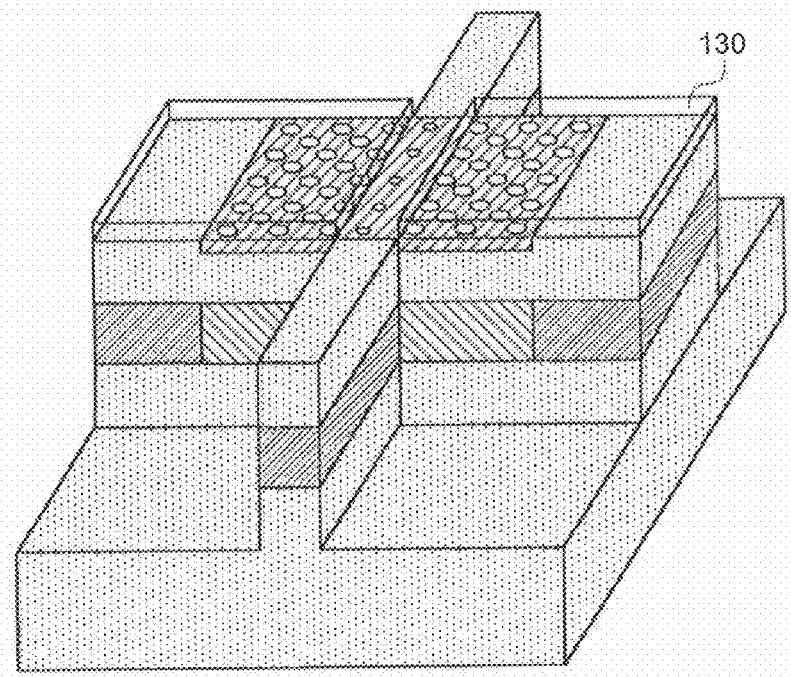
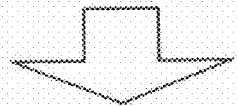
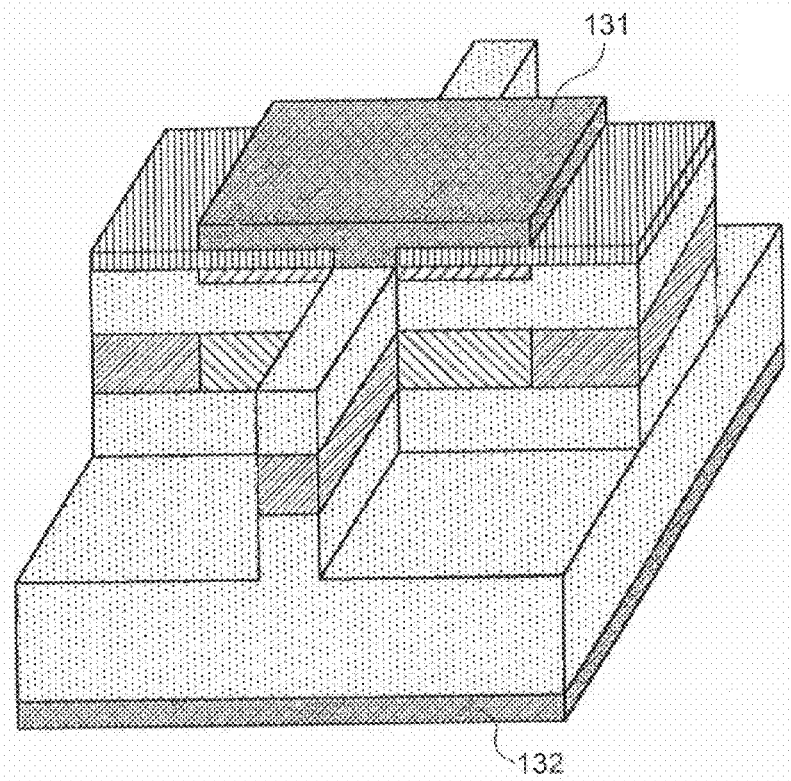

BACKGROUND ART FIG.18
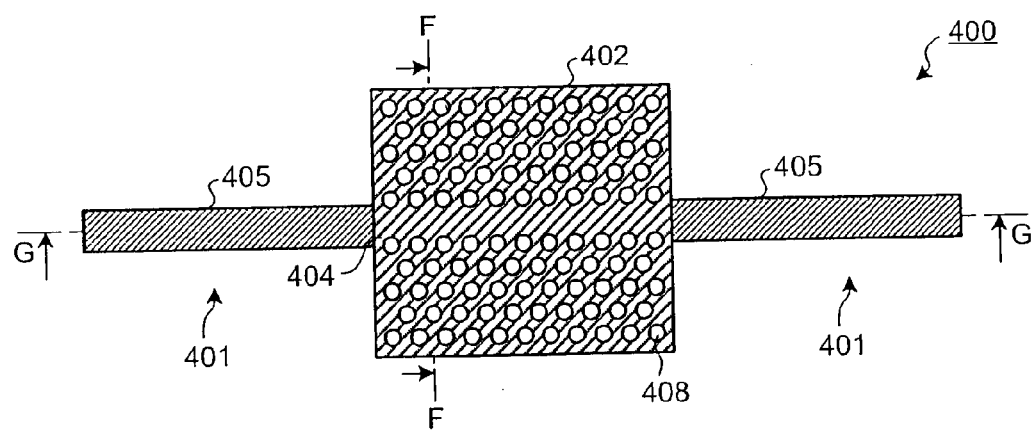
BACKGROUND ART FIG.19
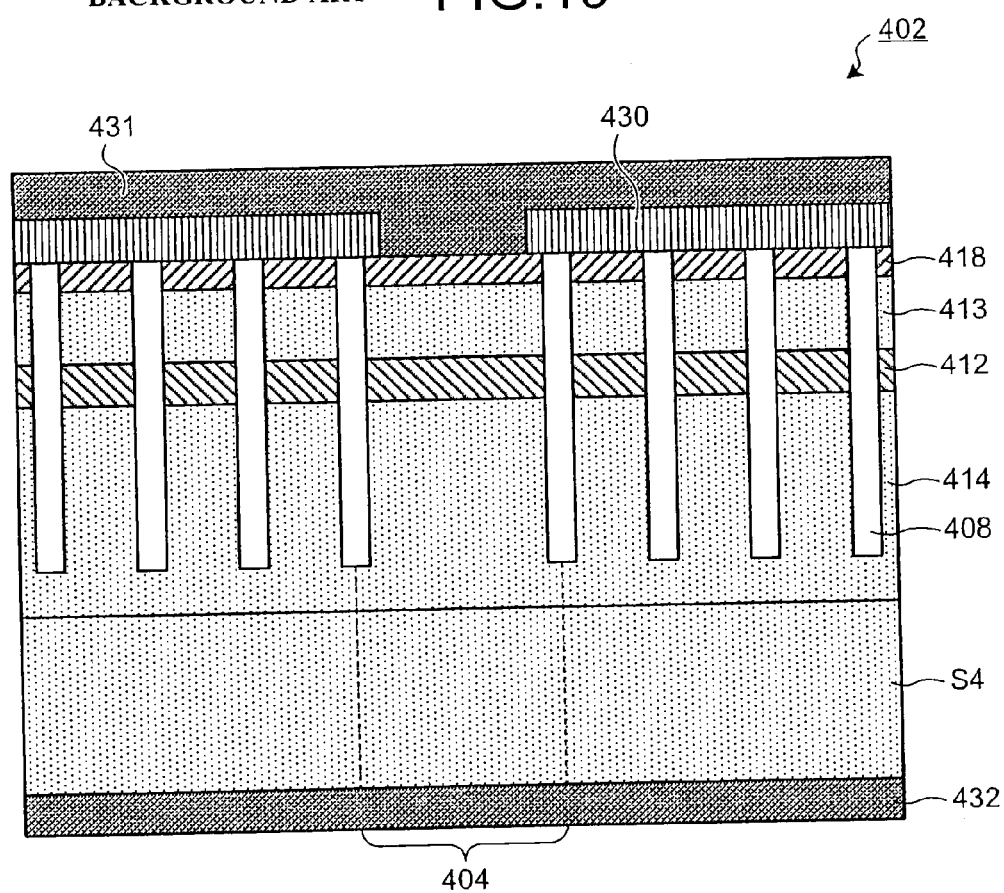

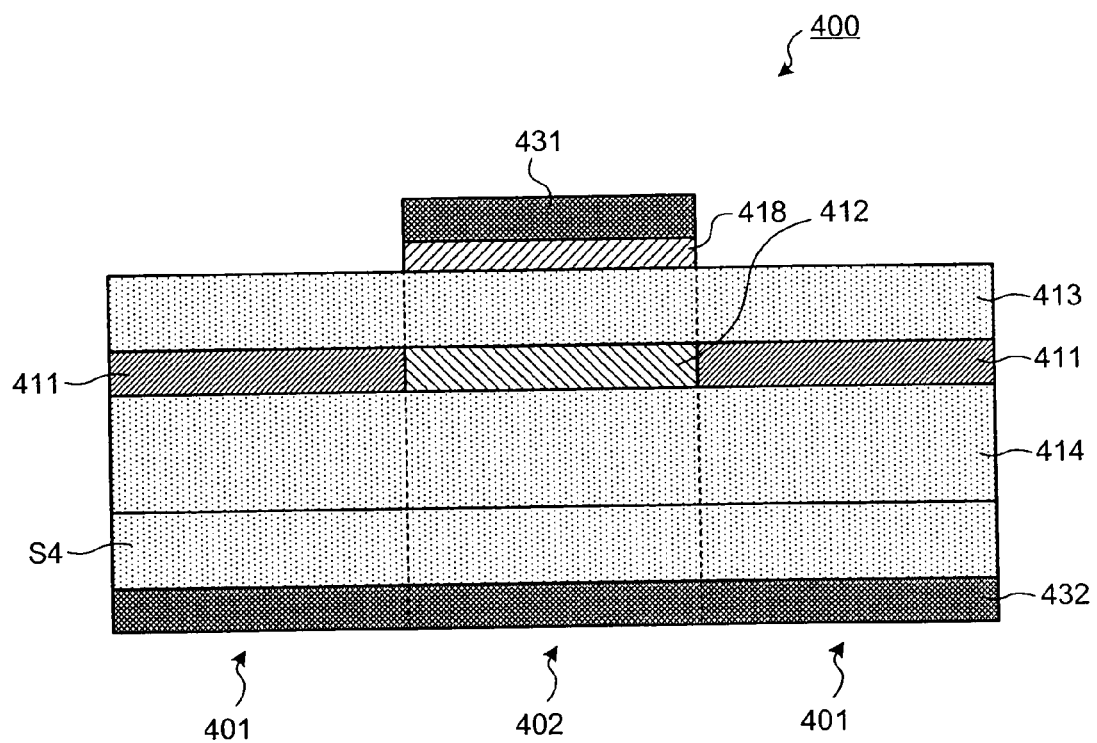
BACKGROUND ART FIG.20

PHOTONIC CRYSTAL OPTICAL DEVICE

CROSS-REFERENCE TO RELATED APPLICATIONS

This application is a continuation of PCT/JP2007/068260 filed on Sep. 20, 2007, the entire content of which are incorporated herein by reference.

BACKGROUND OF THE INVENTION

1. Field of the Invention

The present invention relates to a photonic crystal optical device having an active layer with an optical waveguide formed by a photonic crystal.

2. Description of the Related Art

A photonic crystal has a periodic structure formed by arranging on a semiconductor or the like, mediums of a refractive index different from that of the semiconductor, in a period of about a wavelength of light. Application of the photonic crystal to various optical devices has been studied. A photonic band gap (PBG) to light is formed in the photonic crystal, according to a solution of the Maxwell equation in a periodic field. Light of a wavelength corresponding to the PBG cannot be propagated to any direction in the photonic crystal. When a properly designed defect is introduced into this periodic structure, light is localized in this defective part. Therefore, an optical resonator can be realized by introducing a point defect into the periodic structure, and an optical waveguide, that is, a photonic-crystal optical waveguide, can be realized by introducing a line defect into the periodic structure, for example (see Nonpatent Literatures 1 and 2).

FIG. 18 is a top plan view schematically depicting a conventional photonic crystal optical device used in an optical amplifier or a laser. FIG. 19 is a cross-sectional view cut along a line F-F of the photonic crystal optical device in FIG. 18. FIG. 20 is a cross-sectional view cut along a line G-G of the photonic crystal optical device in FIG. 18. The photonic crystal optical device 400 has an active area 402 and a passive area 401 integrated on a semiconductor substrate S4. The active area 402 has a photonic-crystal optical waveguide 404 formed by providing plural circular holes 408 periodically laid out in the main surface direction of an active layer 412 from an active-area upper cladding layer 413 to a position deeper than a lower surface of the active layer 412, excluding a line defective part which is to guide a light of a predetermined wavelength, in an active area growth portion in which the active layer 412 is grown as an active-area core layer between the active-area upper cladding layer 413 and an active-area lower cladding layer 414. The passive area 401 has a deep ridge passive optical waveguide 405 formed to be optically connected to the photonic-crystal optical waveguide 404, in a passive area growth portion in which a passive-area core layer 411 is grown between a passive-area upper cladding layer 413 and a passive-area lower cladding layer 414. A reference numeral 418 denotes a contact layer, 430 denotes an insulating film, 431 denotes an upper electrode, and 432 denotes a lower electrode. In FIG. 18, the insulating film 430 and the upper electrode 431 are expressed as transparent for the sake of explanation.

The photonic crystal optical device 400 can have a considerably long net optical-path length even with a short element length, by using a low group-velocity effect of the photonic crystal in the photonic-crystal optical waveguide 404. As a result, effective gain can be set considerably high. Therefore, the photonic crystal optical device 400 is small and operates with low power consumption. The low group-velocity effect is a phenomenon that the group velocity becomes zero by Bragg reflection near a boundary of the Brillouin Zone in the wave number space of a photonic crystal, that is, near a wave number value which is an integer times k=π/a where "a" represents a lattice constant of the photonic crystal. The zero group-velocity point is a point at which a differential of an angular frequency with respect to a wave number is zero on a dispersion curve showing a relationship between the wave number and the angular frequency. The photonic-crystal optical waveguide 404 can be designed to have a zero group-velocity point on the dispersion curve at either both or one of a high-frequency side and a low-frequency side within a transmission band. The active layer 412 is designed to have a gain at the zero group-velocity point and in a frequency band near this point on the dispersion curve of the photonic-crystal optical waveguide 404.

The photonic-crystal optical waveguide 404 is made by sequentially forming the active area 402 and the passive area 401 on the semiconductor substrate S4, and thereafter forming a predetermined pattern of the holes 408 using lithography and etching.

Nonpatent Literature 1: A. Talneau, et al., "High external efficiency in a monomode full-photonic-crystal laser under continuous wave electric injection", Applied Physics Letters, v. 85, no. 11, pp. 1913 to 1915 (2004)

Nonpatent Literature 2: H. Takano, et al., "In-plane-type channel drop filter in a two-dimensional photonic crystal slab", Applied Physics Letters, v. 84, no. 13, pp. 2226 to 2228 (2004)

However, according to the conventional photonic crystal optical device, there has been a problem in that power efficiency falls because of a light reflection occurring at a connection between the active area and the passive area due to a slight deviation of about a few micrometers in the patterning at the time of forming a pattern of holes, so that efficiency of optical connection between the active area and the passive area is deteriorated. On the other hand, to prevent the reduction in power efficiency, the deviation of the patterning needs to be prevented; however, it is difficult to control the deviation of about a few micrometers in the patterning.

SUMMARY OF THE INVENTION

It is an object of the present invention to at least partially solve the problems in the conventional technology.

According to an aspect of the present invention, there is provided a photonic crystal optical device including an active area and a passive area integrated on a semiconductor substrate. The active area includes a photonic-crystal optical waveguide formed by periodically arranging a plurality of holes in a primary plane direction of an active-area core layer from an active-area upper cladding layer to a position deeper than a lower surface of the active-area core layer, excluding a line defect portion that guides a light of a predetermined wavelength, in an active-area growth portion in which the active-area core layer including an active layer is grown between the active-area upper cladding layer and an active-area lower cladding layer. The passive area includes a passive optical waveguide, which is optically coupled to the photonic-crystal optical waveguide, formed in a passive-area growth portion in which a passive-area core layer is grown between a passive-area upper cladding layer and a passive-area lower cladding layer. An effective refractive index of a growth structure of the active-area growth portion is larger than an effective refractive index of a growth structure of the passive-area growth portion, and the active layer has a gain at a zero group-velocity point positioned on a high-frequency side on a dispersion curve of the photonic-crystal optical waveguide.

Furthermore, according to another aspect of the present invention, there is provided a photonic crystal optical device including an active area and a passive area integrated on a semiconductor substrate. The active area including a photonic-crystal optical waveguide formed by periodically arranging a plurality of holes in a primary plane direction of an active-area core layer from an active-area upper cladding layer to a position deeper than a lower surface of the active-area core layer, excluding a line defect portion that guides a light of a predetermined wavelength, in an active-area growth portion in which the active-area core layer including an active layer is grown between the active-area upper cladding layer and an active-area lower cladding layer. The passive area includes a passive optical waveguide, which is optically coupled to the photonic-crystal optical waveguide, formed in a passive-area growth portion in which a passive-area core layer is grown between a passive-area upper cladding layer and a passive-area lower cladding layer. An effective refractive index of a growth structure of the active-area growth portion is smaller than an effective refractive index of a growth structure of the passive-area growth portion, and the active layer has a gain at a zero group-velocity point positioned on a low-frequency side on a dispersion curve of the photonic-crystal optical waveguide.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 7 to 10 are perspective views for explaining a manufacturing method of the photonic crystal optical device shown in FIG. 1;

FIG. 18 is a top plan view of a conventional photonic crystal optical device;

FIG. 19 is a cross-sectional view of the conventional photonic crystal optical device in FIG. 18 cut along a line F-F;

FIG. 20 is a cross-sectional view of the conventional photonic crystal optical device in FIG. 18 cut along a line G-G;

DETAILED DESCRIPTION OF THE PREFERRED EMBODIMENTS

Exemplary embodiments of a photonic crystal optical device according to the present invention will be explained below in detail with reference to the accompanying drawings. The present invention is not intended to be limited to the embodiments.

Figure 1:
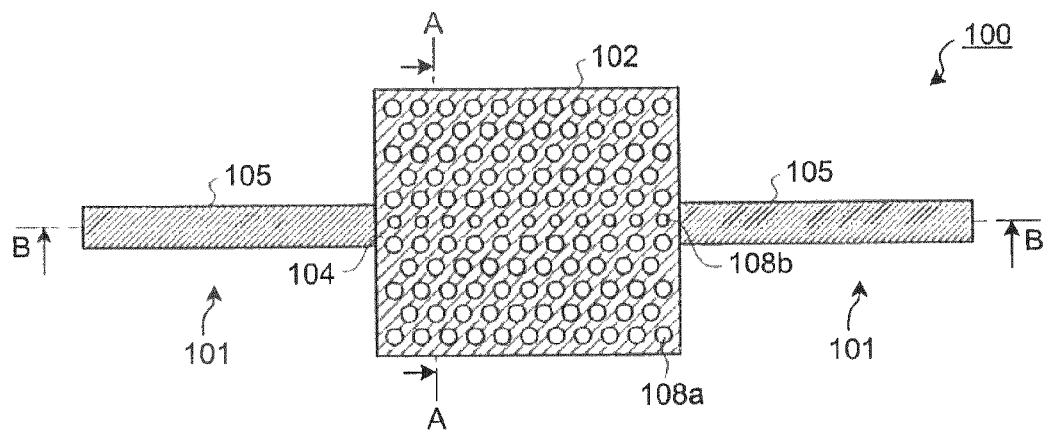
FIG. 1 is a top plan view schematically showing a photonic crystal optical device according to a first embodiment of the present invention.
Figure 2:
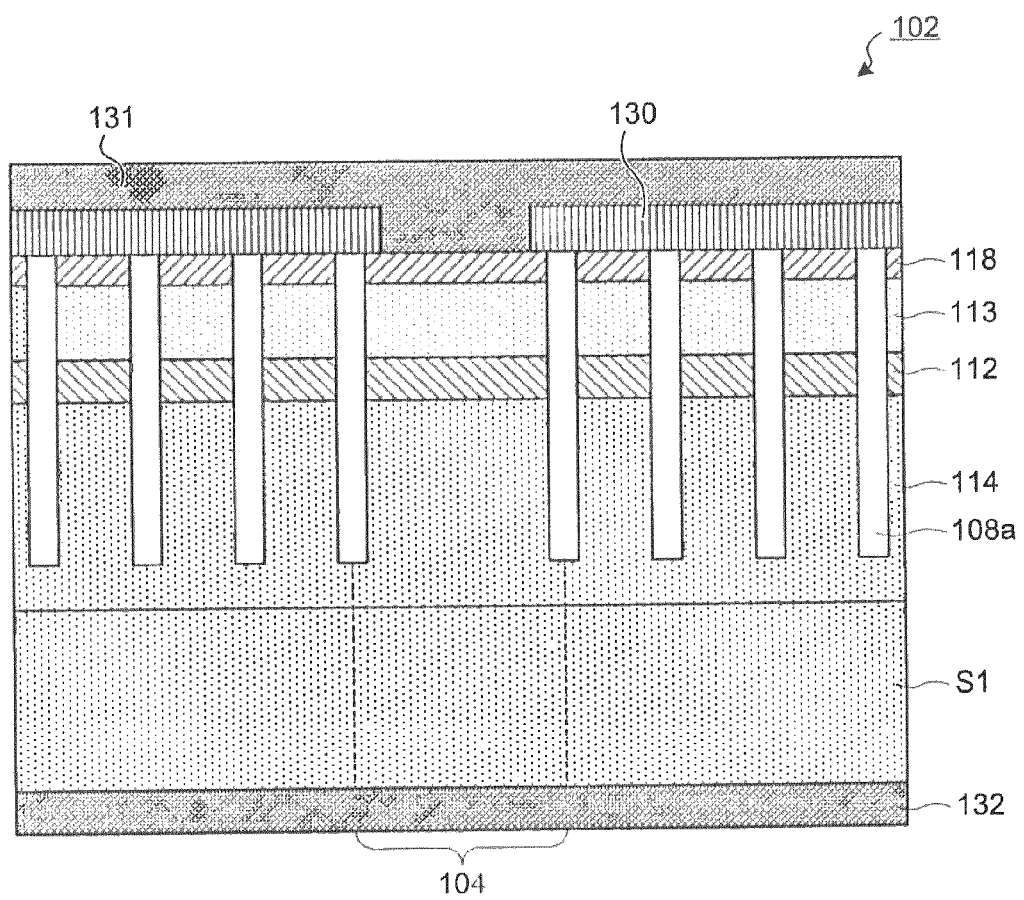
FIG. 2 is a cross-sectional view of the photonic crystal optical device shown in FIG. 1 cut along a line A-A.
Figure 3:
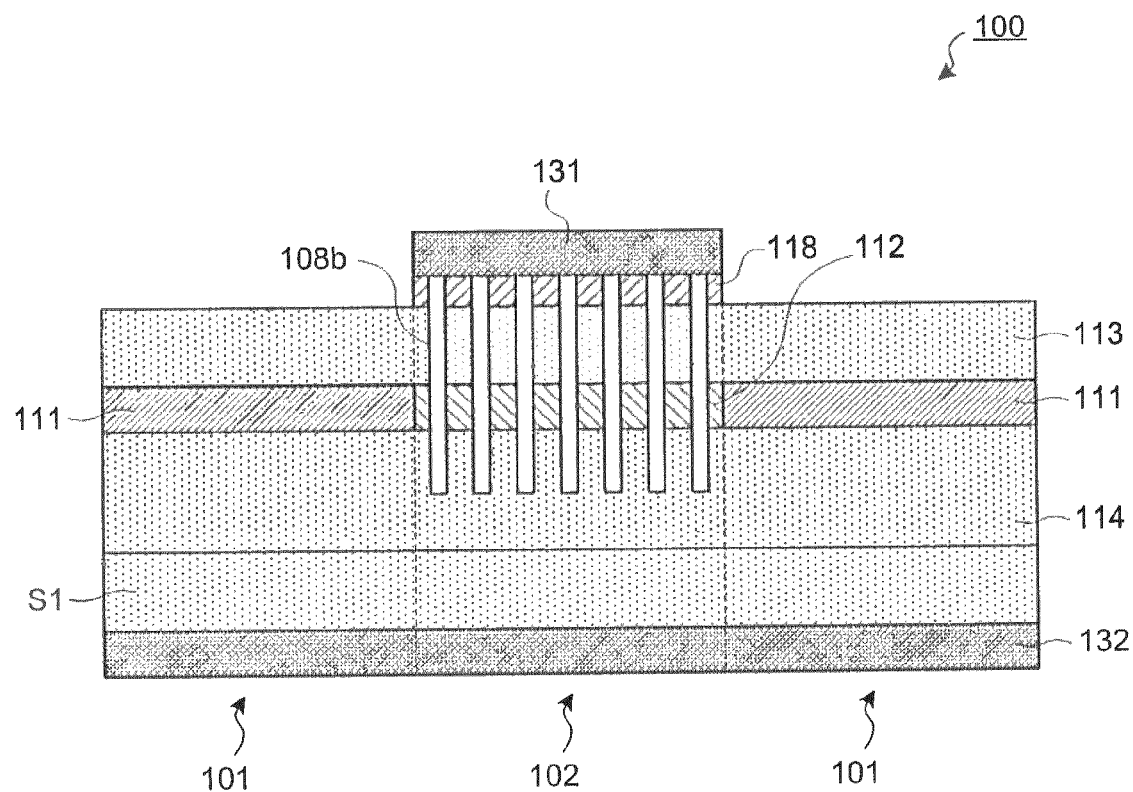
FIG. 3 is a cross-sectional view of the photonic crystal optical device shown in FIG. 1 cut along a line B-B.

First, a photonic crystal optical device according to a first embodiment of the present invention is explained. FIG. 1 is a top plan view schematically depicting the photonic crystal optical device according to the first embodiment of the present invention. FIG. 2 is a cross-sectional view cut along a line A-A of the photonic crystal optical device in FIG. 1, and FIG. 3 is a cross-sectional view cut along a line B-B of the photonic crystal optical device in FIG. 1. As shown in FIGS. 1 to 3, a photonic crystal optical device 100 according to the first embodiment operates as a semiconductor amplifier, and has an active area 102 and a passive area 101 integrated on a semiconductor substrate S1 made of InP. The active area 102 has a photonic-crystal optical waveguide 104 formed by providing plural holes 108a periodically laid out in the main surface direction of an active layer 112 from an upper cladding layer 113 to a part of a lower cladding layer 114 at a position deeper than a lower surface of the active layer 112, excluding a line defective part which is to guide a light of a predetermined wavelength, in an active area growth portion in which the active layer 112 made of GaInAsP is grown as an active-area core layer between the upper cladding layer 113 made of p-InP and the lower cladding layer 114 made of n-InP. The passive area 101 has a deep ridge passive optical waveguide 105 formed to be optically connected to the photonic-crystal optical waveguide 104, in a passive area growth portion formed by having a passive-area core layer 111 made of GaInAsP grown between the upper cladding layer 113 and the lower cladding layer 114 which are common to the active area.

Further, in the active area 102, a contact layer 118 made of GaInAsP is formed on the upper cladding layer 113, and an insulating film 130 made of SiNx is formed on the contact layer 118 excluding a part positioned immediately above the photonic-crystal optical waveguide 104. An upper electrode 131 made of Au/AuZn is formed on the insulating film 130, and is closely in contact with the contact layer 118 at only a position immediately above the photonic-crystal optical waveguide 104 where the insulating film 130 is not formed. Note that, in FIG. 1, the insulating film 130 and the upper electrode 131 are expressed as transparent for the sake of explanation. The upper electrode 131 may be multilayered by having a metal layer made of Ti/Pt/Au, Au or the like formed at the upper part thereof. A lower electrode 132 made of AuGeNi is formed on the lower surface of the substrate S1.

An emission peak wavelength of the active layer 112 is 1550 nanometers, and a gain wavelength band is from 1,480 nanometers to 1580 nanometers. A photoluminescence wavelength of the passive-area core layer 111 is 1.3 micrometers. Each layer has the following thickness. The active layer 112 has a thickness of 505 nanometers, the upper cladding layer 113 has a thickness of 1000 nanometers, the contact layer 118 has a thickness of 200 nanometers, and the passive-area core layer 111 has a thickness of 505 nanometers. A length of the active area 102 in the waveguide direction is designed so that the active layer 112 can obtain a desired gain using a low group-velocity effect of the photonic-crystal optical waveguide 104.

The holes 108a are laid out in a triangular lattice pattern. Each hole has a radius of 105 nanometers, and the holes are laid out with the period of 355 nanometers, in a depth of 3000 nanometers. The photonic-crystal optical waveguide 104 is realized by forming holes 108b, by shifting only one row of the layout of the holes 108 by a half period, and further setting a radius of each hole of the shifted one row to 100 nanometers and in a depth of 3000 nanometers.

The passive area 101 has the deep ridge passive optical waveguide 105 formed in a width of 500 nanometers. The passive optical waveguide 105 has the same height of 3000 nanometers as the depth of the holes 108a. A ridge waveguide having a width of 2000 nanometers is connected to an end of the passive optical waveguide 105 via a spot-size converting part (not shown). A low-reflection coating film (not shown) is formed at the end face of the ridge waveguide 105.

The photonic crystal optical device 100 is inputted with an optical signal of a wavelength within the gain band from one of the passive optical waveguides 105 of the passive area 101, causing the active layer 112 to generate a gain of the wavelength band by a voltage applied between the upper and the lower electrodes 131 and 132 of the active area 102, amplifies the input optical signal while guiding this signal in the photonic-crystal optical waveguide 104, and outputs the amplified optical signal from the other of the passive optical waveguides 105.

In the photonic crystal optical device 100, an effective refractive index of the growth structure of the active area growth portion of the active area 102 is 3.418, and this is larger than an effective refractive index of the growth structure of the passive area growth portion of the passive area 101, which is 3.292.

Figure 5:
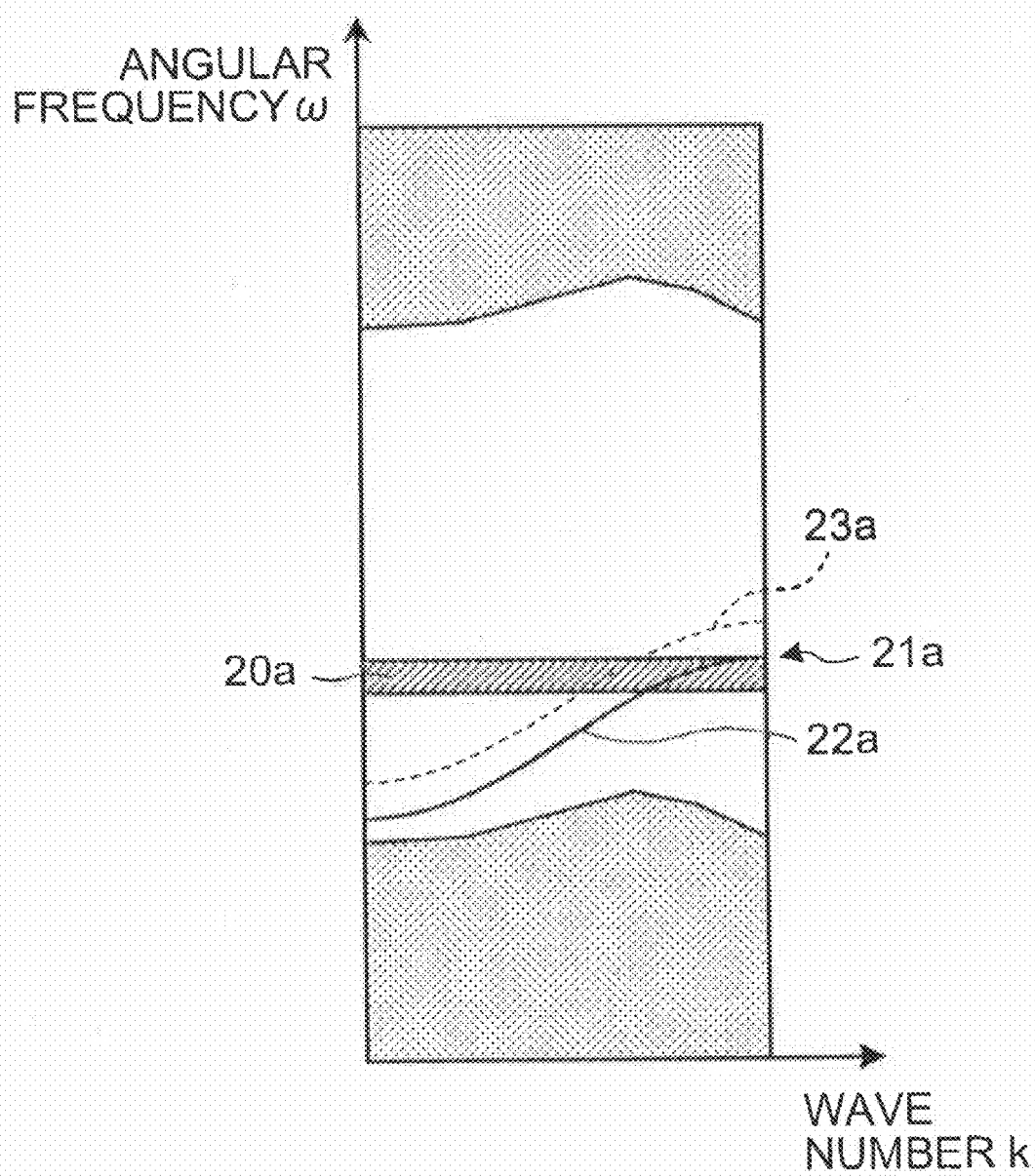
FIG. 5 is a schematic diagram for illustrating a relationship between a dispersion curve of a photonic-crystal optical waveguide and a gain frequency band of an active layer in the photonic crystal optical device shown in FIG. 1.

FIG. 5 schematically depicts a relationship between a dispersion curve 22a of the photonic-crystal optical waveguide 104 and a gain frequency band 20a of the active layer 112. The dispersion curve 22a has such a shape that an angular frequency becomes larger with the increase in the wave number, due to the presence of the holes 108b, and has a zero group-velocity point at the low frequency side and the high group-velocity side, respectively. A reference numeral 21a denotes the zero group-velocity point at the high frequency side. The active layer 112 of the active area 102 is designed to have the gain frequency band 20a of a desired gain at the zero group-velocity point 21a positioned at the high frequency side on the dispersion curve of the photonic-crystal optical waveguide 104. In FIG. 5, an outlined part shows a photonic band gap of the photonic crystal. As described above, the gain frequency band 20a of the active layer 112 corresponds to the wavelength from 1480 nanometers to 1580 nanometers.

As described above, in the photonic crystal optical device 100, the active layer 112 has the gain frequency band 20a at the zero group-velocity point 21a positioned at the high frequency side on the dispersion curve 22a of the photonic-crystal optical waveguide 104. As a result, even when a patterning deviation occurs at the time of forming the holes 108a, the photonic crystal optical device 100 does not suffer a light reflection at the connection between the active area 102 and the passive area 101 and the efficiency of optical connection does not deteriorate. This is explained in detail below.

Figure 4:
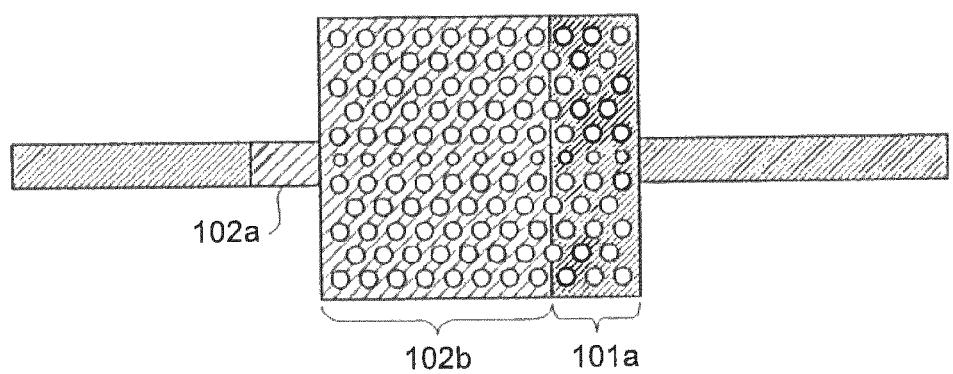
FIG. 4 is an explanatory diagram of a patterning deviation that occurs in the photonic crystal optical device shown in FIG. 1.

First, at the time of forming a pattern of the holes 108a, sometimes the patterning is deviated, and a hole pattern is formed astride the boundary between the active area and the passive area, as shown in FIG. 4. The patterning deviation is in the range of about a few micrometers. As a result, the active area 102a without the photonic-crystal optical waveguide, the active area 102b with the photonic-crystal optical waveguide, and the passive area 101a with the photonic-crystal optical waveguide are formed.

On the other hand, because the effective refractive index of the growth structure of the active area growth portion of the active area 102 is larger than the effective refractive index of the growth structure of the passive area growth portion of the passive area 101, as described above, the effective refractive index becomes smaller than a designed value in the passive area 101a in which the photonic-crystal optical waveguide is formed. As a result, as shown in FIG. 5, the dispersion curve of the photonic-crystal optical waveguide in the passive area 101a shifts to the higher frequency side relative to the dispersion curve 22a of the photonic-crystal optical waveguide formed in the active area 102b, resulting in a dispersion curve 23a.

As described above, the active layer 112 is designed to have the gain frequency band 20a of a desired gain at the zero group-velocity point 21a positioned at the high frequency side on the dispersion curve 22a of the photonic-crystal optical waveguide 104. On the other hand, because the dispersion curve 23a shifts to the higher frequency side relative to the dispersion curve 22a, the dispersion curve 23a intersects with the gain frequency band 20a without exception. That is, in the gain frequency band 20a, a propagation mode is present in the passive area 101a without exception. As a result, the passive area 101a transmits light corresponding to the gain frequency band 20a, and thus light reflection does not occur at the connection between the active area and the passive area. Therefore, the photonic crystal optical device with high efficiency of optical connection and with high power efficiency is obtained. At the same time, positional precision necessary for the patterning of the holes can be relaxed. Therefore, the photonic crystal optical device can be easily manufactured, and production yield improves.

Figure 6:
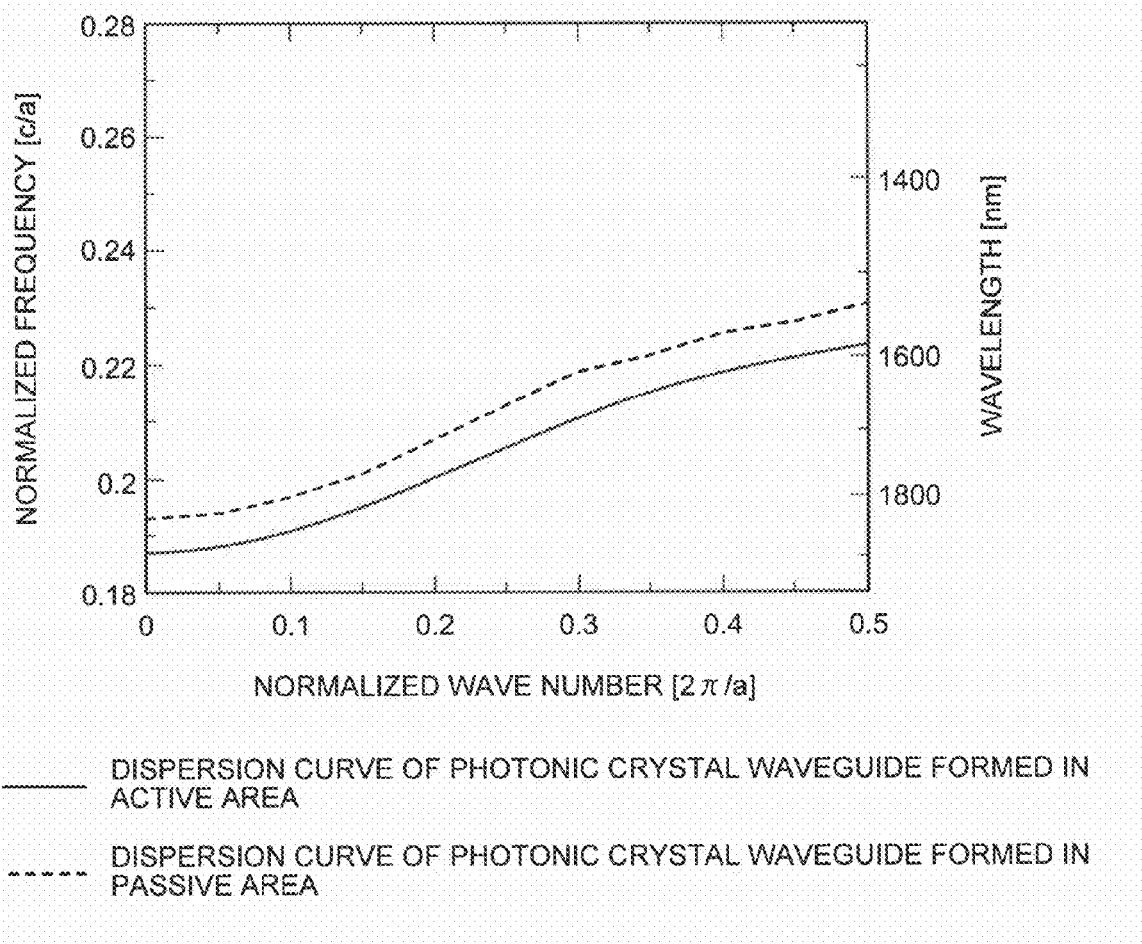
FIG. 6 is a graph of dispersion curves of photonic-crystal optical waveguides formed in the active area and the passive area shown in FIG. 4, obtained by calculation using the finite difference time domain method.

FIG. 6 depicts dispersion curves of the photonic-crystal optical waveguides formed in the active area 102b and the passive area 101*a* shown in FIG. 4, obtained by calculation using the finite difference time domain method. The horizontal axis expresses a normalized wave number, and the vertical axes express normalized frequency and a corresponding wavelength. In FIG. 6, "a" represents a lattice constant of the photonic crystal, and c represents the speed of light. As shown in FIG. 6, it can be confirmed that the dispersion curves have a relationship similar to that of the dispersion curves 22*a* and 23*a* schematically shown in FIG. 5.

Figure 21:
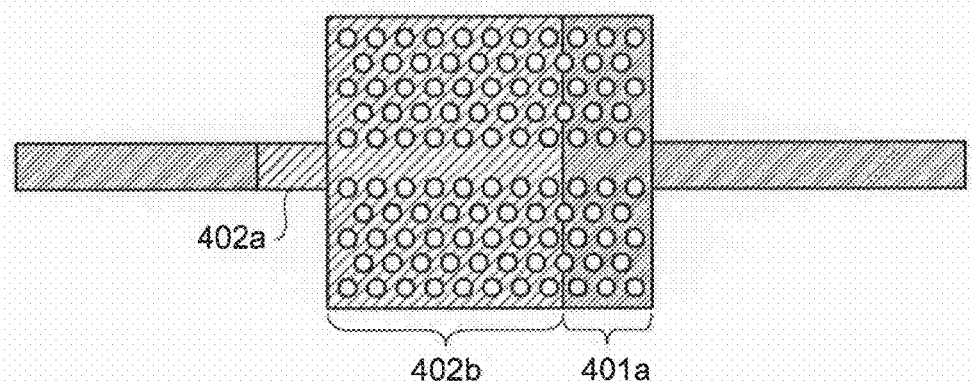
FIG. 21 is a explanatory diagram of a patterning deviation that occurs in the conventional photonic crystal optical device in FIG. 18.
Figure 22:
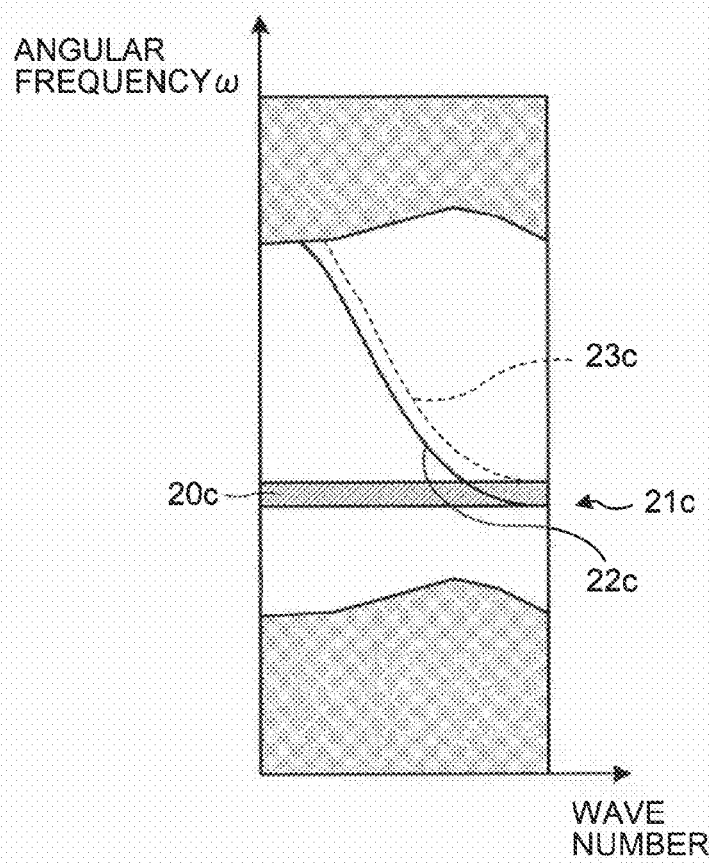
FIG. 22 is a schematic diagram for illustrating a relationship between a dispersion curve of a photonic-crystal optical waveguide and a gain frequency band of an active layer, in the conventional photonic crystal optical device shown in FIG. 18.

On the other hand, the conventional photonic crystal optical device 400 shown in FIGS. 18 to 20 has a dispersion curve 22*c* as shown in FIG. 22. The active layer 412 has a gain frequency band 20*c* of a desired gain at a zero group-velocity point 21*c* positioned at the low frequency side of the dispersion curve 22*c*. If a patterning deviation of the holes as shown in FIG. 21 occurs, the dispersion curve of the photonic-crystal optical waveguide in the passive area 401*a* in which the photonic-crystal optical waveguide is formed shifts to the higher frequency side relative to the dispersion curve 22*c* of the photonic-crystal optical waveguide formed in the active area 402*b*, resulting in a dispersion curve 23*c*. However, unlike the photonic crystal optical device 100, the dispersion curve 23*c* shifted to the high frequency side does not intersect with the gain frequency band 20*c*, and therefore no propagation mode is present in the passive area 401*a* in the gain frequency band 20*c*. As a result, the passive area 401*a* acts as a reflection mirror to the active area 402*b*. Therefore, the efficiency of optical connection between the active area and the passive area is deteriorated by the light reflection at the connection, which decreases power efficiency.

A manufacturing method of the photonic crystal optical device 100 according to the first embodiment is explained next. In the following, a spot-size converting part formed at the front end of the passive optical waveguide 105 is not shown in the drawings.

FIGS. 7 to 10 are perspective views for schematically explaining the manufacturing method of the photonic crystal optical device 100 shown in FIG. 1.

First, as shown in FIG. 7, the lower cladding layer 114, the active layer 112, the upper cladding layer 113, and the contact layer 118 are sequentially grown on the semiconductor substrate S1, using the MOCVD (Metal Organic Chemical Vapor Deposition) method or the MBE (Molecular Beam Epitaxy) method. Next, the contact layer 118, the upper cladding layer 113, and the active layer 112 in a region corresponding to the passive area 102 are removed using photolithography and etching according to the ICP-RIE (Inductivity Coupled Plasma Reactive Ion Etching) method, thereby leaving the active area 102.

Next, as shown in FIG. 8, the passive-area core layer 111 and the upper cladding layer 113 are sequentially grown using the MOCVD method or the MBE method in the passive area 101, using the butt-joint growth method. Next, the pattern of the holes 108*a* and 108*b*, and the deep ridge passive optical waveguide 105 is formed using the electron-beam lithography, on the substrate on which the growth structure is thus formed. Thereafter, the pattern is etched by the ICP-RIE method, using a resist pattern manufactured by lithography or using a dielectric mask to which this resist pattern is transferred by etching, thereby forming the holes 108*a* and 108*b*, and the passive optical waveguide 105.

Next, as shown in FIG. 9, the insulating film 130 is formed on the contact layer 118 of the active area 102, using the PCVD (Plasma Chemical Vapor Deposition) method, and the insulating film 130 is patterned using photolithography, and only the insulating film right on the photonic-crystal optical waveguide 104 is removed by transferring using the RIE method. For the sake of explanation, the insulating film 130 is expressed as transparent. The upper electrode 131 and the lower electrode 132 are sequentially formed using a method of electron-beam evaporation or resistance heated evaporation. At this time, the upper electrode 131 is formed on only the active area 102, using a lift-off process according to photolithography.

Figure 10:
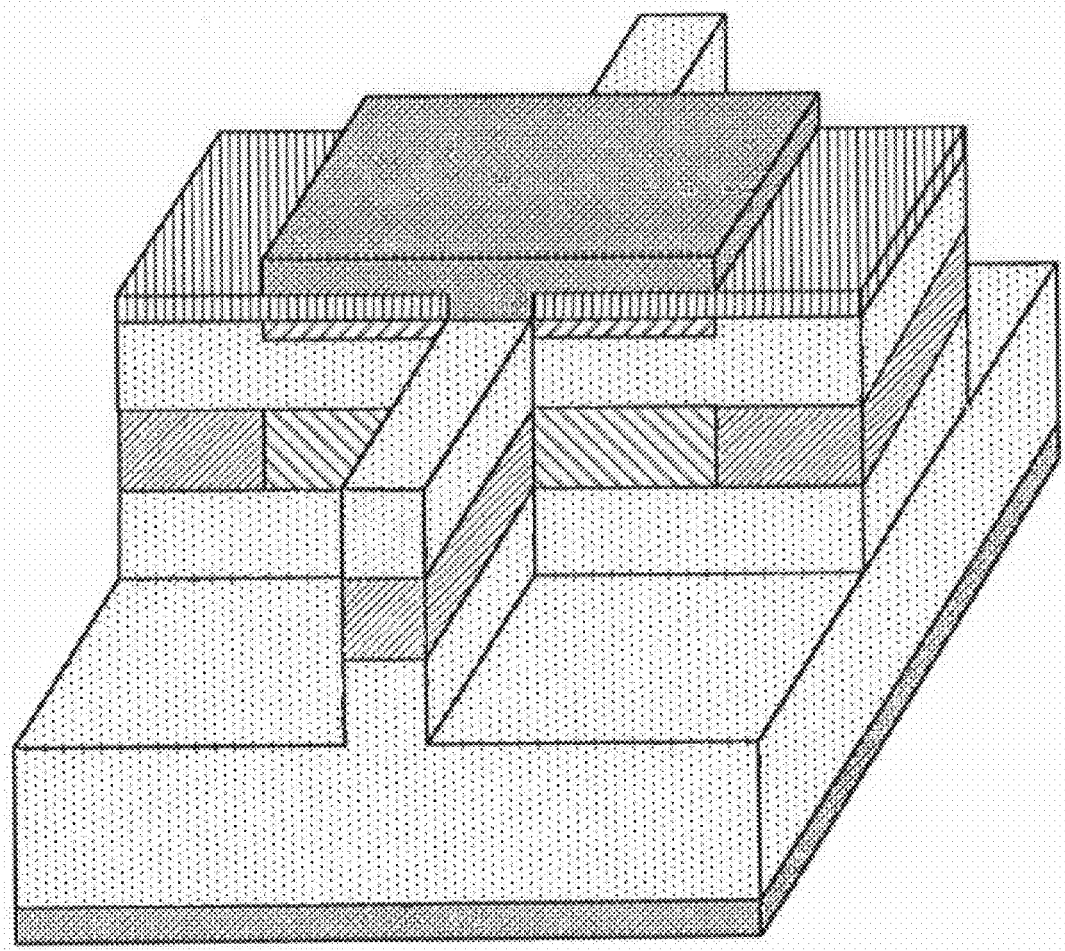

Finally, as shown in FIG. 10, an end surface is formed by cleavage, and a low-reflection coating film is formed on the formed end surface. Thereafter, by cutting into an element of a predetermined size, the photonic crystal optical device 100 according to the first embodiment is produced.

As explained above, according to the photonic crystal optical device 100 of the first embodiment, the effective refractive index of the growth structure of the active area growth portion is larger than the effective refractive index of the growth structure of the passive area growth portion. Further, the active layer 112 has a gain frequency band at the zero group-velocity point positioned at the high-frequency side of the dispersion curve of the photonic-crystal optical waveguide. Therefore, the photonic crystal optical device having high power efficiency and capable of being manufactured easily is obtained.

Next, a photonic crystal optical device according to a second embodiment of the present invention is explained. The photonic crystal optical device according to the second embodiment is different from the photonic crystal optical device according to the first embodiment in the relationship between the effective refractive index of the active area growth portion and the effective refractive index of the passive area growth portion and in the relationship between the dispersion curve of the photonic-crystal optical waveguide and the gain-frequency band.

Figure 11:
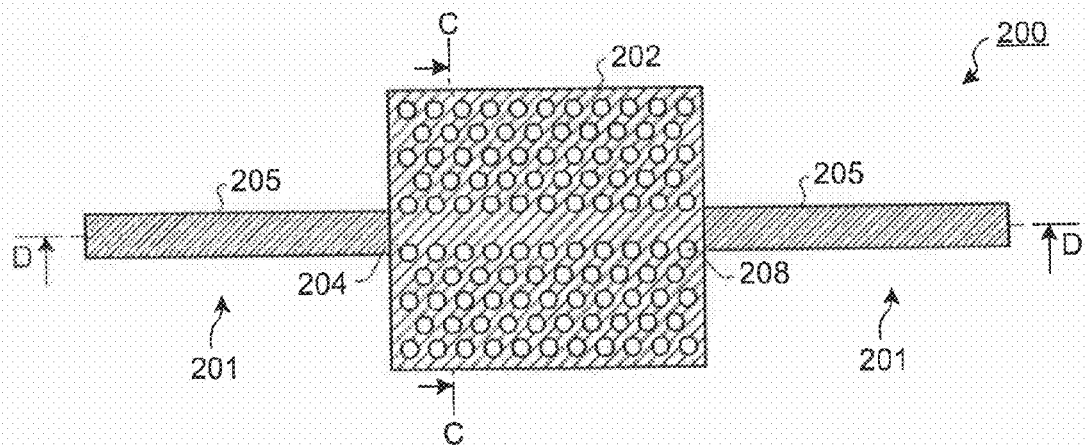
FIG. 11 is a top plan view schematically showing a photonic crystal optical device according to a second embodiment of the present invention.
Figure 12:
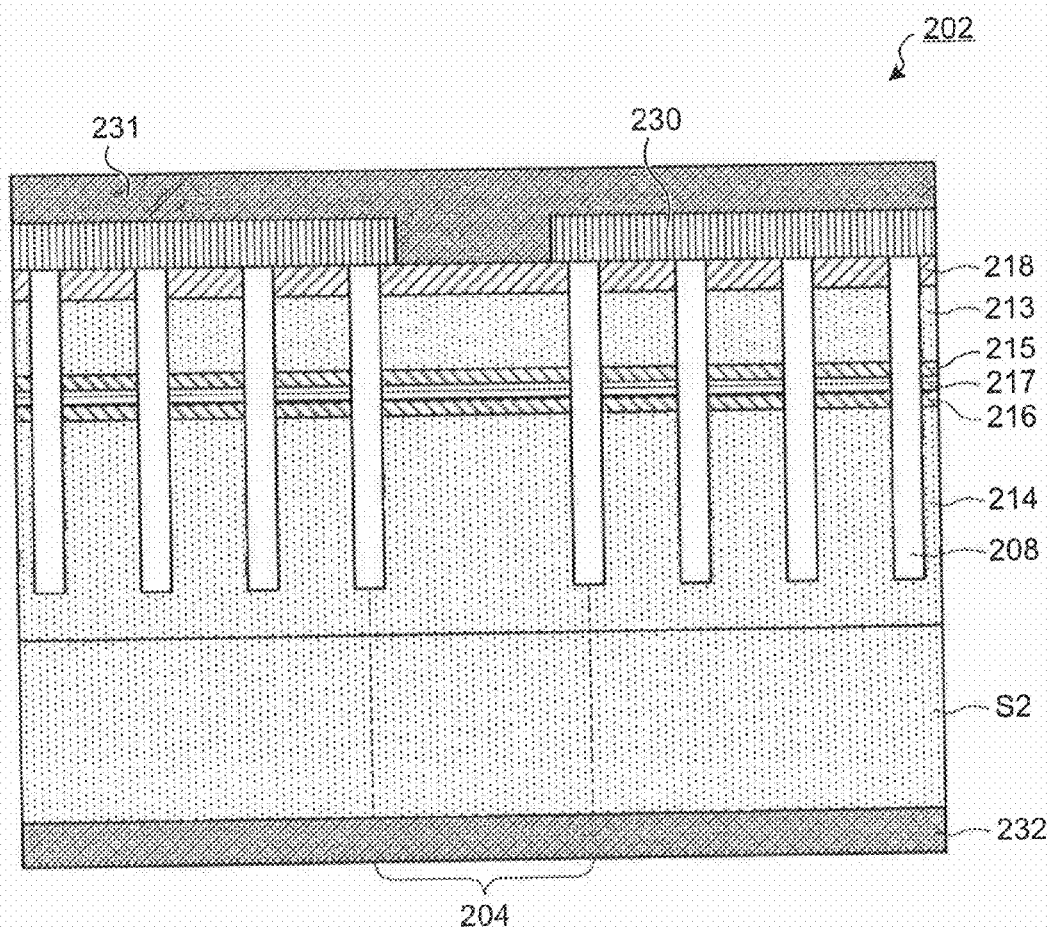
FIG. 12 is a cross-sectional view of the photonic crystal optical device in FIG. 11 cut along a line C-C.
Figure 13:
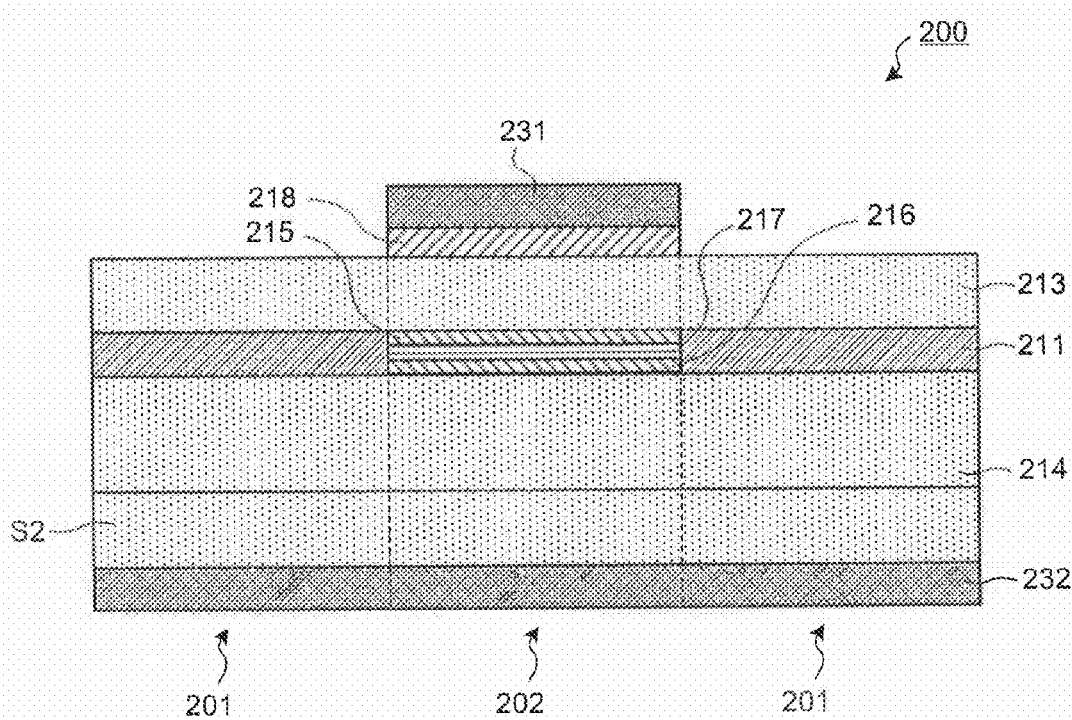
FIG. 13 is a cross-sectional view of the photonic crystal optical device in FIG. 11 cut along a line D-D.

FIG. 11 is a top plan view schematically depicting the photonic crystal optical device according to the second embodiment. FIG. 12 is a cross-sectional view cut along a line C-C of the photonic crystal optical device in FIG. 11. FIG. 13 is a cross-sectional view cut along a line D-D of the photonic crystal optical device in FIG. 11. As shown in FIGS. 11 to 13, a photonic crystal optical device 200 according to the second embodiment operates as a semiconductor amplifier, and has an active area 202 and a passive area 201 integrated on a semiconductor substrate S2 made of InP. The active area 202 has a photonic-crystal optical waveguide 204 formed by providing plural holes 208 periodically laid out in the main surface direction of a multiple-quantum-well active layer 217 from an upper cladding layer 213 to a part of a lower cladding layer 214 at a position deeper than a lower surface of a lower separate confinement layer 216, excluding a line defective part which is to guide a light of a predetermined wavelength, in an active area growth portion in which the multiple-quantum-well active layer 217 made of GaInAsP and an upper separate confinement layer 215 and the lower separate confinement layer 216 made of GaInAsP, respectively, formed to vertically sandwich the multiple-quantum-well active layer 217 are formed by a growth as an active-area core layer, between the upper cladding layer 213 made of P-InP and the lower cladding layer 214 made of n-InP. The passive area 201 has a deep ridge passive optical waveguide 205 formed to be optically connected to the photonic-crystal optical waveguide 204, in a passive area growth portion formed by having a passive-area core layer 211 made of GaInAsP grown between the upper cladding layer 213 and the lower cladding layer 214 common to the active area.

A contact layer 218, an insulating film 230, an upper electrode 231, and a lower electrode 232 similar to those of the photonic crystal optical device 100 according to the first embodiment are formed at predetermined positions. For the sake of explanation, the insulating film 230 and the upper electrode 231 are expressed as transparent in FIG. 11.

An emission peak wavelength of the multiple-quantum-well active layer 217 is 1550 nanometers, and a gain wavelength band is from 1480 nanometers to 1580 nanometers. Photoluminescence wavelengths of the upper separate confinement layer 215 and the lower separate confinement layer 216 are 1150 nanometers, and a photoluminescence wavelength of the passive-area core layer 211 is 1.3 micrometers. Each layer has the following thickness. The multiple-quantum-well active layer 217 has a thickness of 70 nanometers, both the upper separate confinement layer 215 and the lower separate confinement layer 216 have a thickness of 235 nanometers, respectively, the upper cladding layer 213 has a thickness of 1000 nanometers, the contact layer 218 has a thickness of 200 nanometers, and the passive-area core layer 211 has a thickness of 540 nanometers.

The holes 208 are laid out in a triangular lattice pattern. Each hole has a radius of 140 nanometers, and the holes are laid out in the period of 380 nanometers, in a depth of 3000 nanometers. The photonic-crystal optical waveguide 204 is realized by not forming only one row of the arrangement of the holes 208.

The passive optical waveguide 205 formed on the passive area 201 is similar to that of the photonic crystal optical device 100 according to the first embodiment. The passive optical waveguide 205 is connected with a ridge waveguide having a width of 2000 nanometers via a spot-size converting part (not shown), and a low-reflection coating film is formed on an end surface of the passive optical waveguide 205.

In the photonic crystal optical device 200, the effective refractive index of the growth structure of the active area growth portion of the active area 202 is set smaller than the effective refractive index of the growth structure of the passive area growth portion of the passive area 201, by suitably adjusting the compositions and thicknesses of the multiple-quantum-well active layer 217, the upper separate confinement layer 215, and the lower separate confinement layer 216. In the second embodiment, the effective refractive index of the growth structure of the active area growth portion of the active area 202 is 3.237, and this is smaller than the effective refractive index of the growth structure of the passive area growth portion of the passive area 201, which is 3.298.

Figure 14:
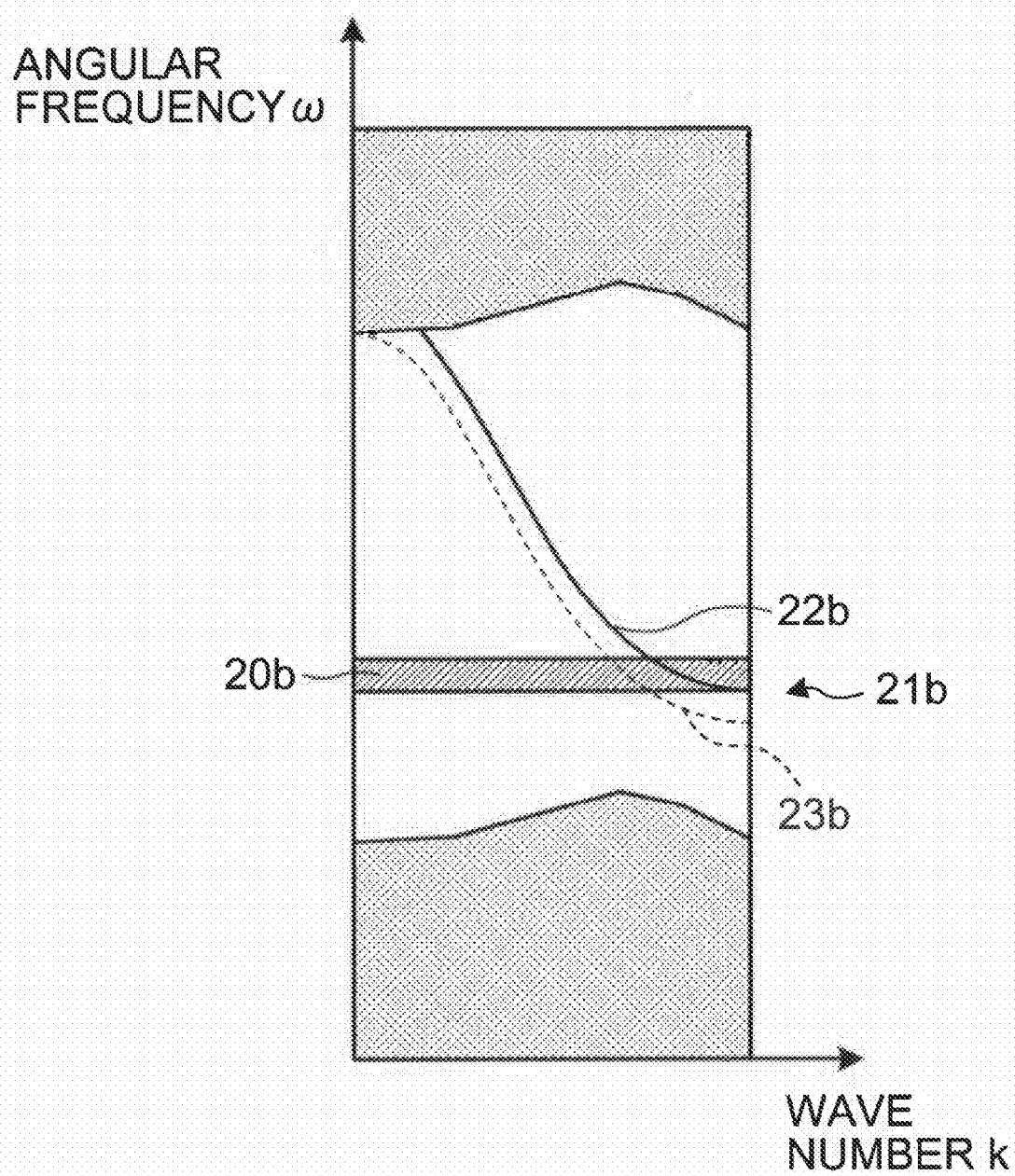
FIG. 14 is a schematic diagram for illustrating a relationship between a dispersion curve of a photonic-crystal optical waveguide and a gain frequency band of a multiple-quantum-well active layer in the photonic crystal optical device in FIG. 11.

FIG. 14 schematically depicts a relationship between a dispersion curve 22b of the photonic-crystal optical waveguide 204 and a gain frequency band 20b of the multiple-quantum-well active layer 217. The multiple-quantum-well active layer 217 of the active area 202 is designed to have the gain frequency band 20b of a desired gain at a zero group-velocity point 21b of the dispersion curve of the photonic-crystal optical waveguide 204. As described above, the gain frequency band 20b of the multiple-quantum-well active layer 217 corresponds to the wavelength from 1480 nanometers to 1580 nanometers.

As shown in FIG. 14, in the photonic crystal optical device 200, the multiple-quantum-well active layer 217 has the gain frequency band 20b at the zero group-velocity point 21b positioned at the low frequency side of the dispersion curve 22b of the photonic-crystal optical waveguide 204. As a result, in the photonic crystal optical device 200, even if a patterning deviation occurs at the time of forming the holes 208, light reflection does not occur at the connection between the active area 202 and the passive area 201, and the efficiency of optical connection is not deteriorated. This is explained in detail below.

First, at the time of forming a pattern of the holes 208, when the patterning is deviated as shown in FIG. 4, the effective refractive index becomes larger than a designed value in the passive area in which the photonic-crystal optical waveguide is formed due to the patterning deviation, because the effective refractive index of the growth structure of the active area growth portion of the active area 202 is smaller than the effective refractive index of the growth structure of the passive area growth portion of the passive area 201. As a result, as shown in FIG. 14, the dispersion curve of the photonic-crystal optical waveguide in the passive area shifts to the lower frequency side relative to the dispersion curve 22b, resulting in a dispersion curve 23b.

That is, because the dispersion curve 23b shifts to the lower frequency side relative to the dispersion curve 22b, the dispersion curve 23b intersects with the gain frequency band 20b without exception. That is, in the gain frequency band 20b, a propagation mode is present without exception in the passive area in which the photonic-crystal optical waveguide is formed. As a result, like in the first embodiment, because the passive area does not act as a reflection mirror to the active area, the photonic crystal optical device with high efficiency of optical connection between the active area and the passive area and with high power efficiency is obtained. At the same time, positional precision necessary for the patterning of the holes can be relaxed. Therefore, the photonic crystal optical device can be easily manufactured.

Figure 15:
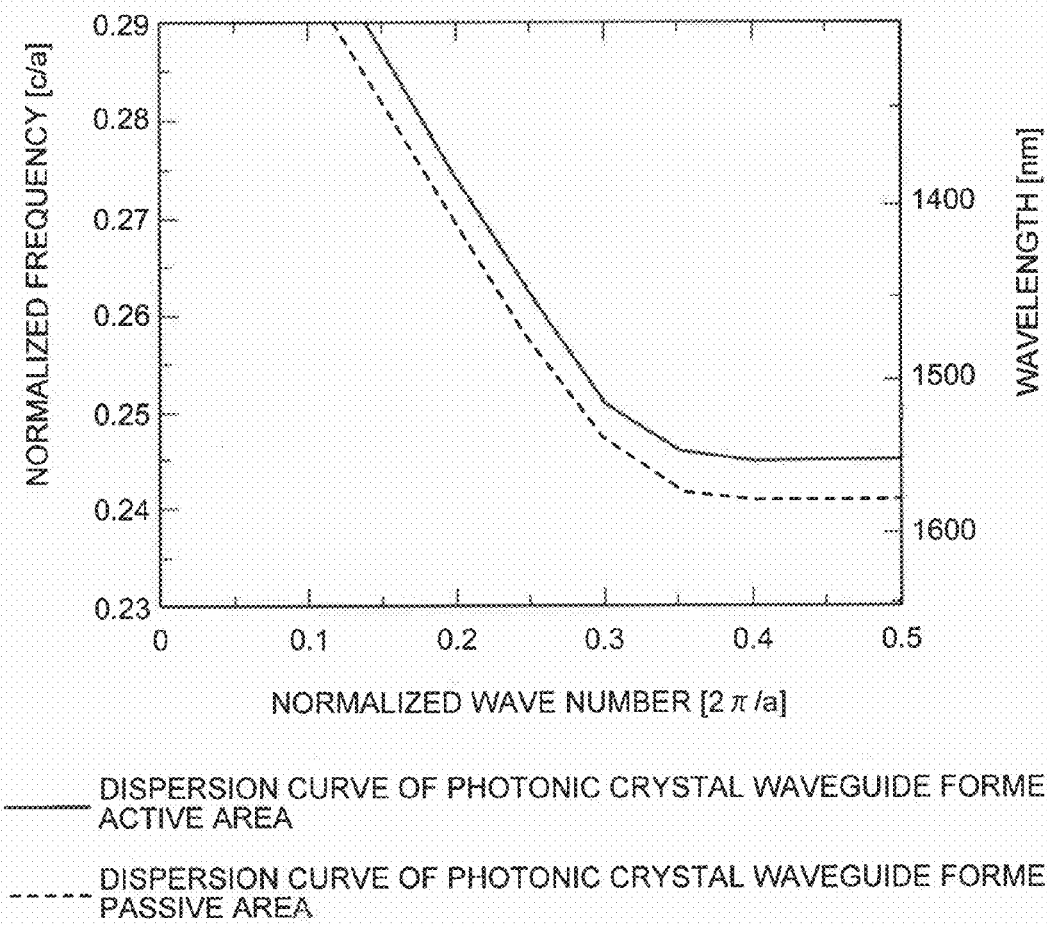
FIG. 15 is a graph of dispersion curves of photonic-crystal optical waveguides formed, due to a patterning deviation, in the active area and the passive area of the photonic crystal optical device shown in FIG. 11, obtained by calculation using the finite difference time domain method.

FIG. 15 depicts dispersion curves of photonic-crystal optical waveguides formed, due to a patterning deviation, in the active area and the passive area of the photonic crystal optical device 200, obtained by calculation using the finite difference time domain method. The horizontal axis expresses a normalized wave number, and the vertical axes express normalized frequency and a corresponding wavelength. As shown in FIG. 15, it can be confirmed that the dispersion curves have a relationship similar to that of the dispersion curves 22b and 23b schematically shown in FIG. 14.

A manufacturing method of the photonic crystal optical device 200 according to the second embodiment is similar to the manufacturing method of the photonic crystal optical device 100 according to the first embodiment shown in FIGS. 7 to 10, except that the upper separate confinement layer 215 and the lower separate confinement layer 216 are formed and that the holes 108b are not formed.

As explained above, according to the photonic crystal optical device 200 of the second embodiment, the effective refractive index of the growth structure of the active area growth portion is smaller than the effective refractive index of the growth structure of the passive area growth portion. Further, the active layer has a gain frequency band at the zero group-velocity point positioned at the low-frequency side of the dispersion curve of the photonic-crystal optical waveguide. Therefore, the photonic crystal optical device having high power efficiency and capable of being manufactured easily is obtained.

Next, a photonic crystal optical device according to a third embodiment of the present invention is explained. The photonic crystal optical device according to the third embodiment is different from the photonic crystal optical device according to the second embodiment in that a passive optical waveguide is an optical waveguide formed with a photonic crystal.

Figure 16:
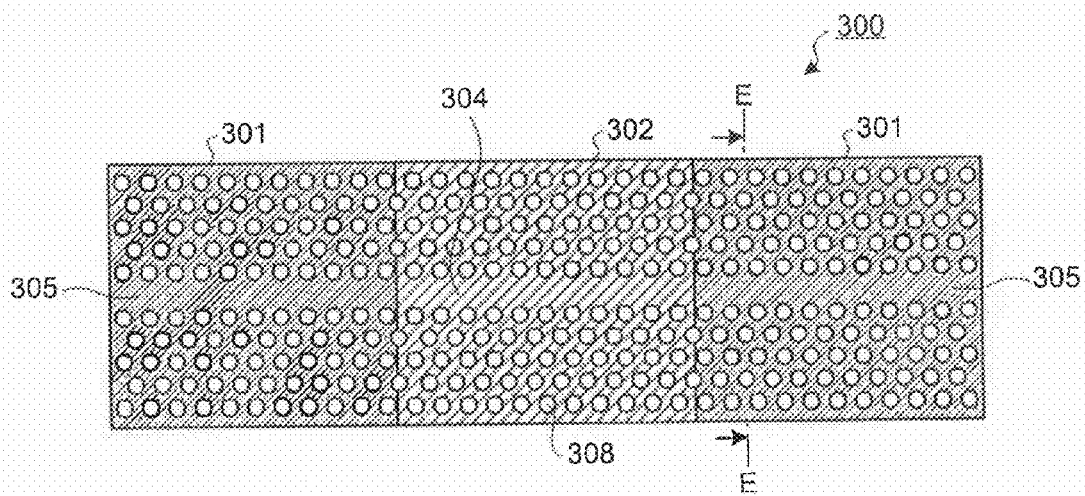
FIG. 16 is a top plan view schematically showing a photonic crystal optical device according to a third embodiment of the present invention.
Figure 17:
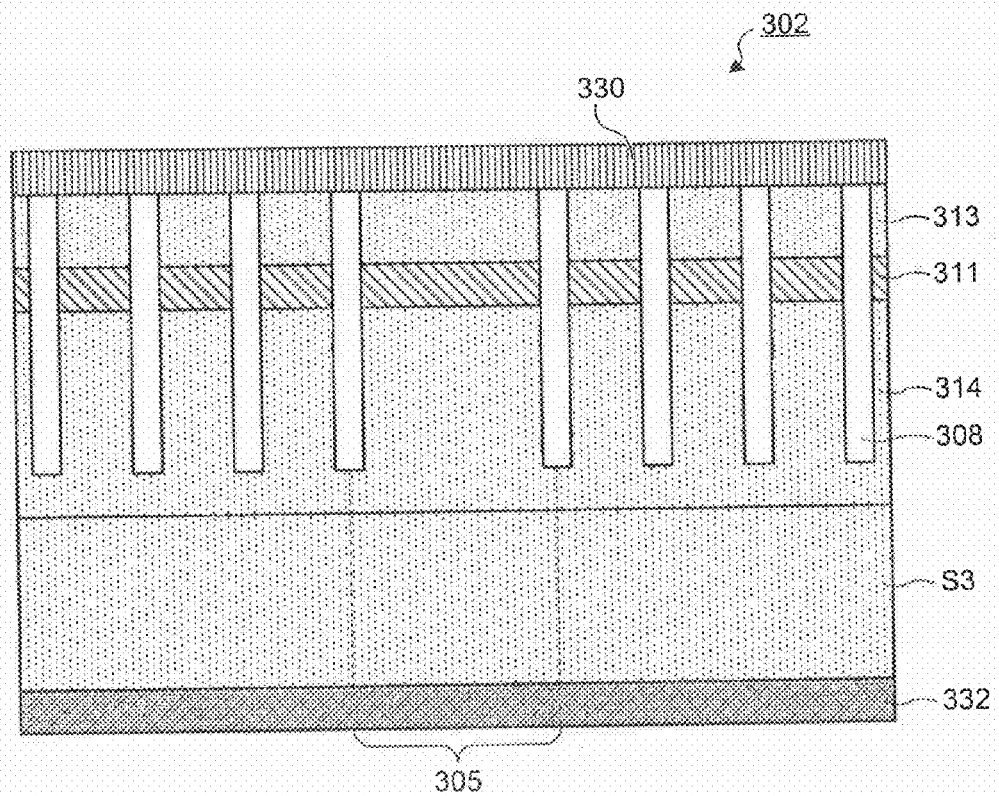
FIG. 17 is a cross-sectional view of the photonic crystal optical device in FIG. 16 cut along a line E-E.

FIG. 16 is a top plan view schematically depicting a photonic crystal optical device according to the third embodiment. FIG. 17 is a cross-sectional view cut along a line E-E of the photonic crystal optical device in FIG. 16. A photonic crystal optical device 300 according to the third embodiment includes an active area 302 similar to the active area 202 of the photonic crystal optical device 200 according to the second embodiment. Holes 308 and a photonic-crystal optical waveguide 304 are also formed similarly. While an insulating film and an upper electrode are also formed similarly, they are expressed as transparent for sake of explanation, in FIG. 16.

On the other hand, in the photonic crystal optical device 300, a passive area 301 has a passive area growth portion similar to that of the passive area 201 of the photonic crystal optical device 200. However, the passive optical waveguide formed in the passive area 301 is a photonic-crystal passive optical waveguide 305 formed by providing plural holes 308 having structural parameters, that is, a radius and a period of layout similar to those of the holes 308 provided in the active area 302, in a similar depth, in the primary plane direction of the passive-area core layer 311, from an upper cladding layer 313 to a part of a lower cladding layer 314 at a position deeper than the lower surface of the passive-area core layer 311, excluding a line defective part which is to guide a light of a predetermined wavelength. A reference symbol S3 denotes a substrate, a reference numeral 330 denotes an insulating film, and 332 denotes a lower electrode, and these are all similar to those formed in the photonic crystal optical device 200. Although not shown, a ridge waveguide having a width of 2000 nanometers is connected to an end of the passive optical waveguide 305 via a spot-size converting part, and a low-reflection coating film is formed at the end face of the passive optical waveguide 305.

The photonic crystal optical device 300 has higher power efficiency and can be manufactured much easier. This is explained specifically below.

In the photonic crystal optical device 100 according to the first embodiment, for example, when a patterning deviation occurs in the holes as shown in FIG. 4, the efficiency of optical connection between the active area 102b and the passive area 101a is not deteriorated as described above. However, the low group-velocity effect of the photonic-crystal optical waveguide cannot be used in the active area 102a in which any photonic-crystal optical waveguide is not formed. Therefore, sometimes, characteristics of the photonic-crystal optical waveguide are different from designed ones.

On the other hand, in the photonic crystal optical device 300 according to the third embodiment, the photonic-crystal passive optical waveguide 305 similar to the photonic-crystal optical waveguide 304 is formed in the passive area 301. Therefore, even when a patterning deviation of the holes occurs, the active area 302 can use the low group-velocity effect of the photonic crystal as designed over the whole region thereof, and operate in designed characteristics. As a result, power efficiency becomes much higher and necessary precision of patterning is considerably relaxed, and thus the photonic crystal optical device capable of being manufactured more easily is obtained.

Further, because the photonic crystal optical device 300 has the photonic crystals of the same structural parameters formed in the active area 302 and the passive area 301, the manufacturing becomes much easier.

A manufacturing method of the photonic crystal optical device 300 according to the third embodiment is similar to the manufacturing method of the photonic crystal optical device 200 according to the second embodiment, except that the pattern of holes similar to that of the active area is formed in the passive area in place of forming the pattern of the deep ridge passive optical waveguide in the passive area.

Figure 23:
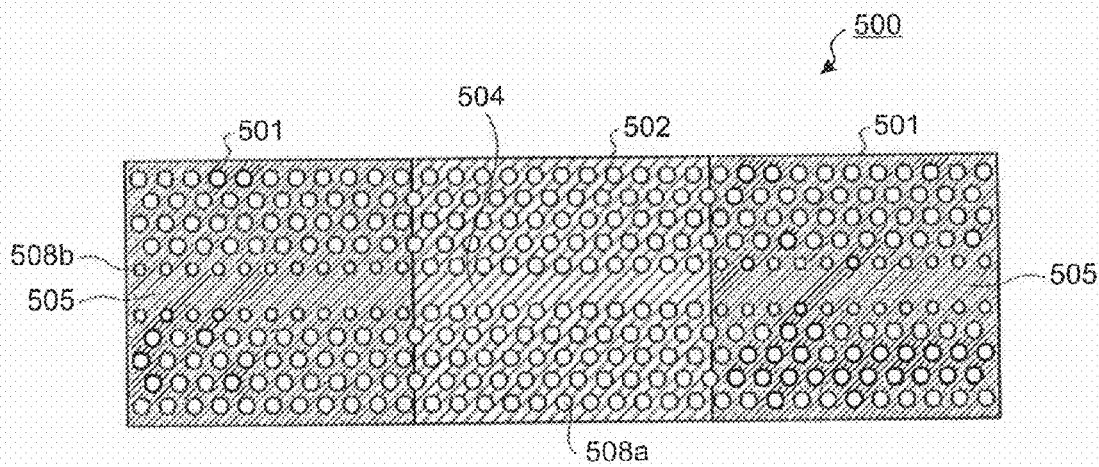
FIG. 23 is a top plan view of a passive optical waveguide configured using a photonic crystal in the conventional photonic crystal optical device shown in FIG. 18.

To structure the passive optical waveguide using the photonic crystal in the conventional photonic crystal optical device 400, it is necessary to use different structural parameters between a photonic-crystal passive optical waveguide 505 in a passive area 501 and a photonic-crystal optical waveguide 504 in an active area 502, like a photonic crystal optical device 500 shown in FIG. 23. Therefore, in the photonic crystal optical device 500, holes 508b having structural parameters different from those of holes 508a are formed at the innermost sides of the photonic-crystal passive optical waveguide 505. In this case, the manufacturing becomes complex.

Further, in the photonic crystal optical device 300 according to the third embodiment, the photonic-crystal passive optical waveguide 305 is formed over the whole passive area 301. However, it is sufficient that the photonic-crystal passive optical waveguide 305 is formed in a range sufficiently larger than the precision of the patterning at a part connected to the active area 302. A deep ridge passive optical waveguide can be connected to or formed at an end of the waveguide.

In the above embodiment, materials of various layers including the active layer and the wavelength of light that laser oscillates are not limited to those described in the above embodiment. Any compound semiconductor can be used for the layers, and the wavelength of light to be amplified can be also arbitrarily designed according to selected materials.

As described above, according to an aspect of the present invention, the effective refractive index of the growth structure of the active area growth portion is larger than the effective refractive index of the growth structure of the passive area growth portion. Further, the active layer has a gain at the zero group-velocity point positioned at the high-frequency side of the dispersion curve of the photonic-crystal optical waveguide. Therefore, even when a patterning deviation occurs at the time of forming the photonic crystal of the active area, a light reflection does not occur at the connection between the active area and the passive area, and the efficiency of optical connection is not deteriorated. As a result, there is an effect that the photonic crystal optical device having high power efficiency and capable of being manufactured easily is realized.

Furthermore, according to another aspect of the present invention, the effective refractive index of the growth structure of the active area growth portion is smaller than the effective refractive index of the growth structure of the passive area growth portion. Further, the active layer has a gain at the zero group-velocity point positioned at the low-frequency side of the dispersion curve of the photonic-crystal optical waveguide. Therefore, even when a patterning deviation occurs at the time of forming the photonic crystal of the active area, a light reflection does not occur at the connection between the active area and the passive area, and the efficiency of optical connection is not deteriorated. As a result, there is an effect that the photonic crystal optical device having high power efficiency and capable of being manufactured easily is realized.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A photonic crystal optical device comprising:
   an active area and a passive area integrated on a semiconductor substrate,
   the active area including a photonic-crystal optical waveguide formed by periodically arranging a plurality of holes in a primary plane of an active-area core layer from an active-area upper cladding layer to a position deeper than a lower surface of the active-area core layer, excluding a line defect portion that guides a light of a predetermined wavelength, in an active-area growth portion in which the active-area core layer including an active layer is grown between the active-area upper cladding layer and an active-area lower cladding layer, the passive area including a passive optical waveguide, which is optically coupled to the photonic-crystal optical waveguide, formed in a passive-area growth portion formed by growing a passive-area core layer between a passive-area upper cladding layer and a passive-area lower cladding layer, wherein an effective refractive index of a growth structure of the active-area growth portion is larger than an effective refractive index of a growth structure of the passive-area growth portion, and the active layer has a gain at a zero group-velocity point positioned on a high-frequency side of a dispersion curve of the photonic-crystal optical waveguide, wherein, even when a patterning misalignment deviation occurs during formation of the plurality of holes, said light of the predetermined wavelength passes between the active area and the passive area without substantial additional reflection loss, and efficient optical coupling between the active area and the passive area is maintained.

2. The photonic crystal optical device according to claim 1, wherein at least a part of the passive optical waveguide formed in the passive area coupled to the active area is a photonic-crystal passive optical waveguide formed by arranging a plurality of holes periodically in a primary plane of the passive-area core layer from the passive-area upper cladding layer to a position deeper than a lower surface of the passive-area core layer, excluding a line defect portion that guides a light of a predetermined wavelength.

3. The photonic crystal optical device according to claim 2, wherein the photonic-crystal passive optical waveguide and the photonic-crystal optical waveguide have same dimensions and relative positions of respective holes.

4. A photonic crystal optical device comprising:
an active area and a passive area integrated on a semiconductor substrate,
the active area including a photonic-crystal optical waveguide formed by periodically arranging a plurality of holes in a primary plane of an active-area core layer from an active-area upper cladding layer to a position deeper than a lower surface of the active-area core layer, excluding a line defect portion that guides a light of a predetermined wavelength, in an active-area growth portion in which the active-area core layer including an active layer is grown between the active-area upper cladding layer and an active-area lower cladding layer,
the passive area including a passive optical waveguide, which is optically coupled to the photonic-crystal optical waveguide, formed in a passive-area growth portion formed by growing a passive-area core layer between a passive-area upper cladding layer and a passive-area lower cladding layer, wherein
an effective refractive index of a growth structure of the active-area growth portion is smaller than an effective refractive index of a growth structure of the passive-area growth portion, and
the active layer has a gain at a zero group-velocity point positioned on a low-frequency side of a dispersion curve of the photonic-crystal optical waveguide,
wherein, even when a patterning misalignment deviation occurs during formation of the plurality of holes, said light of the predetermined wavelength passes between the active area and the passive area without substantial additional reflection loss, and efficient optical coupling between the active area and the passive area is maintained.

5. The photonic crystal optical device according to claim 4, wherein the active-area core layer includes an upper separate confinement layer and a lower separate confinement layer formed to sandwich the active layer.

6. The photonic crystal optical device according to claim 4, wherein at least a part of the passive optical waveguide formed in the passive area coupled to the active area is a photonic-crystal passive optical waveguide formed by arranging a plurality of holes periodically in a primary plane of the passive-area core layer from the passive-area upper cladding layer to a position deeper than a lower surface of the passive-area core layer, excluding a line defect portion that guides a light of a predetermined wavelength.

7. The photonic crystal optical device according to claim 5, wherein at least a part of the passive optical waveguide formed in the passive area coupled to the active area is a photonic-crystal passive optical waveguide formed by arranging a plurality of holes periodically in a primary plane of the passive-area core layer from the passive-area upper cladding layer to a position deeper than a lower surface of the passive-area core layer, excluding a line defect portion that guides a light of a predetermined wavelength.

8. The photonic crystal optical device according to claim 6, wherein the photonic-crystal passive optical waveguide and the photonic-crystal optical waveguide have same dimensions and relative positions of the respective holes.

9. The photonic crystal optical device according to claim 7, wherein the photonic-crystal passive optical waveguide and the photonic-crystal optical waveguide have same dimensions and relative positions of the respective holes.

10. A photonic crystal optical device comprising,
a semiconductor substrate;
an active area on the semiconductor substrate, including
an active-area upper cladding layer,
an active-area lower cladding layer,
an active-area core layer between the active-area upper cladding layer and the active-area lower cladding layer, and
a photonic-crystal optical waveguide having a plurality of holes in a primary plane of the active-area core layer, arranged outside a line defect portion that guides a light of a predetermined wavelength, the plurality of holes extending from the active area upper cladding layer to under a lower surface of the active-area core layer; and
a passive area on the semiconductor substrate, including
a passive-area upper cladding layer,
a passive-area lower cladding layer,
a passive-area core layer between the passive-area upper cladding layer and the passive-area lower cladding layer,
a passive optical waveguide disposed in the passive-area core layer and optically coupled to the photonic-crystal optical waveguide, wherein
the passive area is adjacent to the active area,
an effective refractive index of the active area is larger than an effective refractive index of the passive area, and
the active layer has a gain at a zero group-velocity point positioned on a high-frequency side of a dispersion curve of the photonic-crystal optical waveguide,
wherein, even when a patterning misalignment deviation occurs during formation of the plurality of holes, said light of the predetermined wavelength passes between the active area and the passive area without substantial additional reflection loss, and efficient optical coupling between the active area and the passive area is maintained.

11. A photonic crystal optical device comprising,
a semiconductor substrate;
an active area on the semiconductor substrate, including
an active-area upper cladding layer,
an active-area lower cladding layer,
an active-area core layer between the active-area upper cladding layer and the active-area lower cladding layer, and
a photonic-crystal optical waveguide having a plurality of holes in a primary plane of the active-area core layer, arranged outside a line defect portion that guides a light of a predetermined wavelength, the plurality of holes extending from the active area upper cladding layer to under a lower surface of the active-area core layer; and
a passive area on the semiconductor substrate, including
a passive-area upper cladding layer,
a passive-area lower cladding layer,
a passive-area core layer between the passive-area upper cladding layer and the passive-area lower cladding layer,
a passive optical waveguide disposed in the passive-area core layer and optically coupled to the photonic-crystal optical waveguide, wherein
the passive area is adjacent to the active area,
an effective refractive index of the active area is smaller than an effective refractive index of the passive area, and
the active layer has a gain at a zero group-velocity point positioned on a low-frequency side of a dispersion curve of the photonic-crystal optical waveguide,
wherein, even when a patterning misalignment deviation occurs during formation of the plurality of holes, said light of the predetermined wavelength passes between the active area and the passive area without substantial additional reflection loss, and efficient optical coupling between the active area and the passive area is maintained.

12. The photonic crystal optical device according to claim 1,
wherein one row of the plurality of holes are shifted by a half period from an adjacent row, and the diameter of the holes in the shifted row being smaller than the diameter of the arranged plurality of holes.

13. The photonic crystal optical device according to claim 1, wherein the active area has a gain frequency band which includes the zero group-velocity point positioned on the high-frequency side of a dispersion curve of the photonic-crystal optical waveguide.

* * * * *